US011146187B2

(12) United States Patent
Iino et al.

(10) Patent No.: US 11,146,187 B2
(45) Date of Patent: Oct. 12, 2021

(54) INERTIAL FORCE IMPARTING DEVICE AND TACTILE SENSATION PRESENTING DEVICE

(71) Applicant: Seiko Instruments Inc., Chiba (JP)

(72) Inventors: Akihiro Iino, Chiba (JP); Takayuki Satodate, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 0 days.

(21) Appl. No.: 16/773,386

(22) Filed: Jan. 27, 2020

(65) Prior Publication Data
US 2020/0252009 A1  Aug. 6, 2020

(30) Foreign Application Priority Data

Feb. 6, 2019  (JP) .............................. JP2019-019888
Nov. 26, 2019  (JP) .............................. JP2019-213242

(51) Int. Cl.
| | | |
|---|---|---|
| *H02N 10/00* | (2006.01) | |
| *G06F 3/01* | (2006.01) | |
| *G06F 3/041* | (2006.01) | |
| *H05K 5/00* | (2006.01) | |
| *F03G 7/06* | (2006.01) | |
| *H05K 5/06* | (2006.01) | |

(52) U.S. Cl.
CPC ............. *H02N 10/00* (2013.01); *F03G 7/065* (2013.01); *G06F 3/016* (2013.01); *G06F 3/041* (2013.01); *H05K 5/0017* (2013.01); *H05K 5/06* (2013.01)

(58) Field of Classification Search
CPC ....... F03G 7/065; G04G 21/08; G06F 1/1626; G06F 1/163; G06F 1/1637; G06F 1/1643; G06F 1/1656; G06F 3/016; G06F 3/041; H02N 10/00; H05K 5/0017; H05K 5/06
See application file for complete search history.

(56) References Cited

U.S. PATENT DOCUMENTS

2013/0154984 A1* 6/2013 Gondo .................... G06F 1/169
345/173

FOREIGN PATENT DOCUMENTS

WO  WO 2012-023606 A1  2/2012

* cited by examiner

*Primary Examiner* — Afroza Chowdhury
(74) *Attorney, Agent, or Firm* — Crowell & Moring LLP

(57) ABSTRACT

The present invention is provided to prevent intrusion of dust, moisture, and the like, and simulatively deliver a kinetic operation feeling in response to an operation of an operator, and generate vibrations as necessary and separately from the operation of the operator. There is provided an inertial force imparting device including a stator, a mover that is arranged to be movable relative to the stator in a movable direction, a weight attached to the mover, an actuator unit that includes a shape memory alloy wire provided between the stator and the mover, instantaneously displaces the mover in the movable direction, and delivers an inertial force to the outside based on the displacement, and an elastic member that biases the mover toward the stator side along the movable direction, in which the shape memory alloy wire changes in length according to temperature, and changes the interval between the mover and the stator by expansion and contraction according to energization heating.

9 Claims, 24 Drawing Sheets

Fig. 1
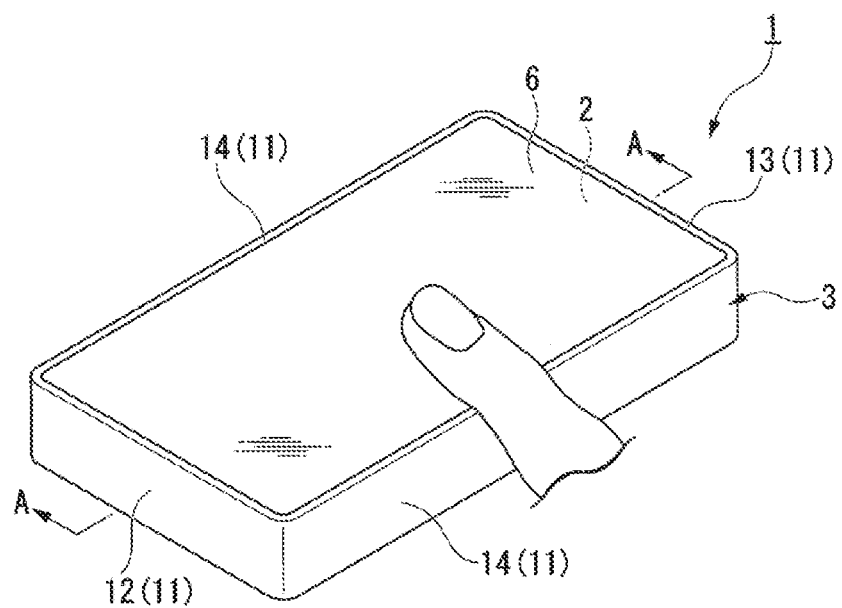
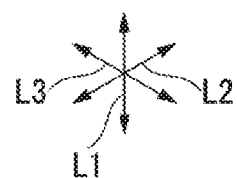

INERTIAL FORCE IMPARTING DEVICE AND TACTILE SENSATION PRESENTING DEVICE

RELATED APPLICATIONS

This application claims priority to Japanese Patent Application Nos. 2019-019888 filed on Feb. 6, 2019, and 2019-213242 filed on Nov. 26, 2019, the entire contents of which are incorporated herein by reference.

BACKGROUND OF THE INVENTION

1. Field of the Invention

The present disclosure relates to an inertial force imparting device and a tactile sensation presenting device.

2. Description of the Related Art

In recent years, portable information terminals such as smartphones, smartwatches, and tablet PCs, and electronic devices such as in-vehicle navigation systems, and the like often incorporate a tactile sensation presenting device that presents a tactile sensation by vibration in response to an operation by an operator.

For example, as shown in WO2012/023606, a tactile sensation presenting device is known, in which, when a contact panel arranged on a front side of a touch panel is touched with a fingertip, a kinetic operating feeling (so-called click sensation) is simulatively delivered to the fingertip by instantaneously moving the contact panel using a shape memory alloy wire.

The contact panel is covered with the touch panel, while being supported by a housing to be movable in the in-plane direction of the contact panel. Therefore, when the contact panel is touched with the fingertip, only the contact panel can be moved using the shape memory alloy wire.

SUMMARY OF THE INVENTION

However, with the related tactile sensation presenting device described in WO2012/023606, it is necessary to move the contact panel with respect to the housing, and thus it is necessary to leave some gap between the contact panel and the housing. For this reason, for example, there is a possibility of dust and moisture entering through the gap, which needs improvement. In particular, the range of use is limited from the viewpoint of waterproofness and the like.

Furthermore, when the tactile sensation presenting device of the related art is applied to a portable information terminal such as a smartphone, it is difficult to use the contact panel also as a vibration source for informing the event when a call or mail is received, for example. For this reason, it is necessary to separately provide a vibration source such as a vibration motor or a vibration actuator, which is likely to increase the number of parts and increase the cost.

The present invention has been made in view of such circumstances, and an object thereof is to provide an inertial force imparting device and a tactile sensation presenting device, which are capable of preventing intrusion of dust, moisture, and the like, and simulatively delivering a kinetic operation feeling in response to an operation of an operator, and generating vibrations as necessary and separately from the operation of the operator.

(1) The inertial force imparting device according to the present invention includes a stator, a mover arranged to be movable relative to the stator in a movable direction, a weight attached to the mover, an actuator unit that includes a shape memory alloy wire provided between the stator and the mover, instantaneously displaces the mover in the movable direction, and delivers an inertial force to the outside based on the displacement, and an elastic member that biases the mover toward the stator side along the movable direction, in which the shape memory alloy wire changes in length according to temperature, and changes an interval between the mover and the stator by expansion and contraction according to energization heating.

According to the inertial force imparting device according to the present invention, the actuator unit can be used to instantaneously displace the mover to which the weight is attached, and the mover can be moved along the movable direction at a predetermined acceleration, for example. Specifically, upon energizing the shape memory alloy wire, the shape memory alloy wire can be instantaneously contracted, for example, and the mover can be separated away from the stator. As a result, the mover to which the weight is attached can be instantaneously moved along the movable direction, and based on the displacement (movement) of the mover, it is possible to deliver the inertial force (thrust) of the mover and the weight to the outside. Therefore, by using this inertial force, it is possible to simulatively deliver a kinetic operation feeling to the fingertip of the operator, for example, and to deliver a tactile sensation as if giving a click feeling to the fingertip.

Furthermore, by radiating the heat generated by energization heating from the shape memory alloy wire, the shape memory alloy wire can be expanded instantaneously, for example, and the mover can be approached closer to the stator side. At this time, since the mover can be biased by using the elastic restoring force (biasing force) by the elastic member, the mover can be reliably approached toward the stator side according to expansion and contraction of the shape memory alloy wire. Therefore, the mover can be instantaneously moved in the opposite direction along the movable direction, and again, a tactile sensation as if giving a click feeling may be delivered to the fingertip of the operator.

Therefore, since it is possible to vibrate the mover in the movable direction by utilizing expansion and contraction of the shape memory alloy wire, vibration can be generated as necessary. In addition, an impulse-like vibration can be generated, such as, for example, a tactile sensation close to that of a mechanical switch can be delivered, or a tactile sensation different from that of a vibration motor or the like can also be delivered.

Furthermore, with the inertial force imparting device being housed in the casing, for example, the inertial force of the mover and the weight can be delivered to the entire casing. Therefore, for example, it is not necessary to provide a gap between the operation panel and the casing, which is otherwise required in the related art, and even when the inside of the casing is kept sealed, a tactile sensation as if giving a click feeling can be delivered to the fingertip of the operator touching on the casing, for example. For this reason, it is also possible to prevent intrusion of dust or moisture into the casing. Therefore, as there is no need for a special dustproof and waterproof structure or the like, the casing can be sealed with a simple structure, and it allows use for various applications without being restricted by the use environment.

(2) The actuator unit may include a heat transfer body arranged to contact the shape memory alloy wire.

In this case, for example, the heat of the shape memory alloy wire can be efficiently radiated using the heat transfer body, and the temperature of the shape memory alloy wire heated by the energization heating can be quickly reduced. As a result, the shape memory alloy wire can be provided with good heat radiation characteristics, and the responsiveness to the expansion and contraction operation can be enhanced.

(3) The elastic member may be formed such that an elastic modulus in the movable direction is lower than the elastic modulus in an orthogonal direction orthogonal to the movable direction, and may guide the mover to be movable along the movable direction according to a difference in elastic modulus.

In this case, the elastic member is easily elastically deformed in the movable direction, and is hardly elastically deformed in the orthogonal direction orthogonal to the movable direction. For this reason, by using the elastic member, the mover can be moved more smoothly with less rattling along the movable direction.

(4) The weight may be attached to the mover so that at least a portion thereof has an overlapping positional relationship with at least one of the mover, the shape memory alloy wire, the elastic member, and the stator, in an orthogonal direction orthogonal to the movable direction.

In this case, since the weight may be designed to be larger, the weight may be formed heavier accordingly. Therefore, a larger inertial force may be delivered to the outside, and for example, a tactile sensation as if giving a clearer click feeling can be effectively delivered to the fingertip of the operator. Moreover, since at least a portion of the weight is arranged to overlap with at least any one of the mover, the shape memory alloy wire, the elastic member, and the stator in the orthogonal direction, the weight, the mover, the shape memory alloy wire, the elastic member, and the stator can be arranged compactly in the movable direction, and the size of the entire inertial force imparting device can be prevented from increasing in the movable direction. Therefore, it is possible to make the weight heavy while preventing the size of the entire inertial force imparting device from increasing in the movable direction.

(5) The elastic member may be provided such that at least a portion thereof has an overlapping positional relationship with the shape memory alloy wire in an orthogonal direction orthogonal to the movable direction.

In this case, since at least a portion of the elastic member is arranged to overlap with the shape memory alloy wire in the orthogonal direction, the elastic member and the shape memory alloy wire can be arranged compactly in the movable direction. Therefore, it is easier to more effectively prevent the size of the entire inertial force imparting device from increasing in the movable direction.

(6) A guide member that guides the mover to be movable in the movable direction may be provided.

In this case, by using the guide member, the mover can be moved more smoothly with less rattling along the movable direction.

(7) The mover may be formed of the same material as the weight and may be formed integrally with the weight.

In this case, since the mover itself can also be used as a weight, the entire weight of the mover and the weight can be increased. Therefore, a larger inertia force can be delivered to the outside.

(8) The stator includes a fixing plate arranged along the movable direction, and a plurality of fixed pins attached to the fixing plate to protrude in an orthogonal direction orthogonal to the movable direction, the mover may include a movable plate which is disposed along the movable direction and is disposed such that at least a portion thereof faces the fixing plate in the orthogonal direction, and a plurality of movable pins attached to the movable plate to protrude in the orthogonal direction, the plurality of fixed pins and the plurality of movable pins may be arranged to be alternately arranged at certain intervals along a direction orthogonal to the movable direction and the orthogonal direction, and the shape memory alloy wire may be interposed between the fixed pins and the movable pins in a wave shape while alternately contacting the fixed pins and the movable pins.

In this case, the shape memory alloy wire is interposed between the fixed pins and the movable pins in a wave shape (zigzag shape) while alternately contacting the fixed pins and the movable pins. Therefore, the intervals between the plurality of fixed pins and the plurality of movable pins can be changed in the movable direction by expansion and contraction of the shape memory alloy wire. As a result, it is possible to instantaneously displace the mover to which the weight attached in the movable direction by utilizing the expansion and contraction of the shape memory alloy wire.

In the stator and the mover, the portions that come into contact with the shape memory alloy wire are required to have insulating properties and to have a predetermined thermal conductivity. In this respect, regarding the stator, since the stator is configured by attaching the fixed pins to the fixing plate, it is sufficient that at least the fixed pins have an insulating property and a predetermined thermal conductivity, and the stator can be simply configured. Therefore, the stator can be manufactured at a low cost. In addition, since the fixing plate can be formed of a material different from that of the fixed pins, such as a synthetic resin material, the degree of freedom in material selection can be improved, and further cost reduction can be easily achieved.

In addition, since the mover is also provided with the movable pins, the same effect as that of the stator described above can be achieved.

(9) A tactile sensation presenting device according to the present invention includes the inertial force imparting device, a casing having an operation panel to be operated by a fingertip and housing the inertial force imparting device therein, a display panel provided on the casing and displaying information through the operation panel, and a control unit housed in the casing and controlling the display of the display panel in accordance with an operation of the operation panel.

With the tactile sensation presenting device according to the present invention, when the operation panel is operated with a fingertip while information displayed on the display panel is visually recognized, the inertial force of the mover and the weight can be delivered to the entire casing based on the instantaneous displacement of the mover in the inertial force imparting device housed in the casing. Therefore, a kinetic operation feeling can be simulatively delivered to the fingertip touching on the operation panel, and a tactile sensation as if giving a click feeling to the fingertip can be delivered.

In particular, since the casing can be sealed as described above, it allows use for various applications without being restricted by the use environment. Therefore, it is possible to provide a tactile sensation presenting device with excellent usability, and for example, the tactile sensation presenting device can be suitably used as a portable information terminal such as a smartphone or a smartwatch. Furthermore, for example, it is also possible to vibrate the casing by displacing the mover as necessary and separately from the operation of the operator. As a result, it possible to notify the operator of incoming calls or mail, for example, and there is no need to provide a dedicated vibration source (for example, a vibration motor). Therefore, the configuration can be simplified and the cost can be reduced.

According to the present invention, it is possible to prevent intrusion of dust, moisture, and the like, and simulatively deliver a kinetic operation feeling in response to the operation of the operator, and generate vibrations as necessary and separately from the operation of the operator.

BRIEF DESCRIPTION OF THE DRAWINGS

FIG. 1 is an external perspective view showing a first embodiment of a portable information terminal (tactile sensation presenting device) according to the present invention;

DETAILED DESCRIPTION OF THE PREFERRED EMBODIMENTS

First Embodiment

Hereinafter, a first embodiment according to the present invention will be described with reference to the drawings. In the present embodiment, a portable information terminal such as a smartphone will be described as an example of the tactile sensation presenting device.

Figure 2:
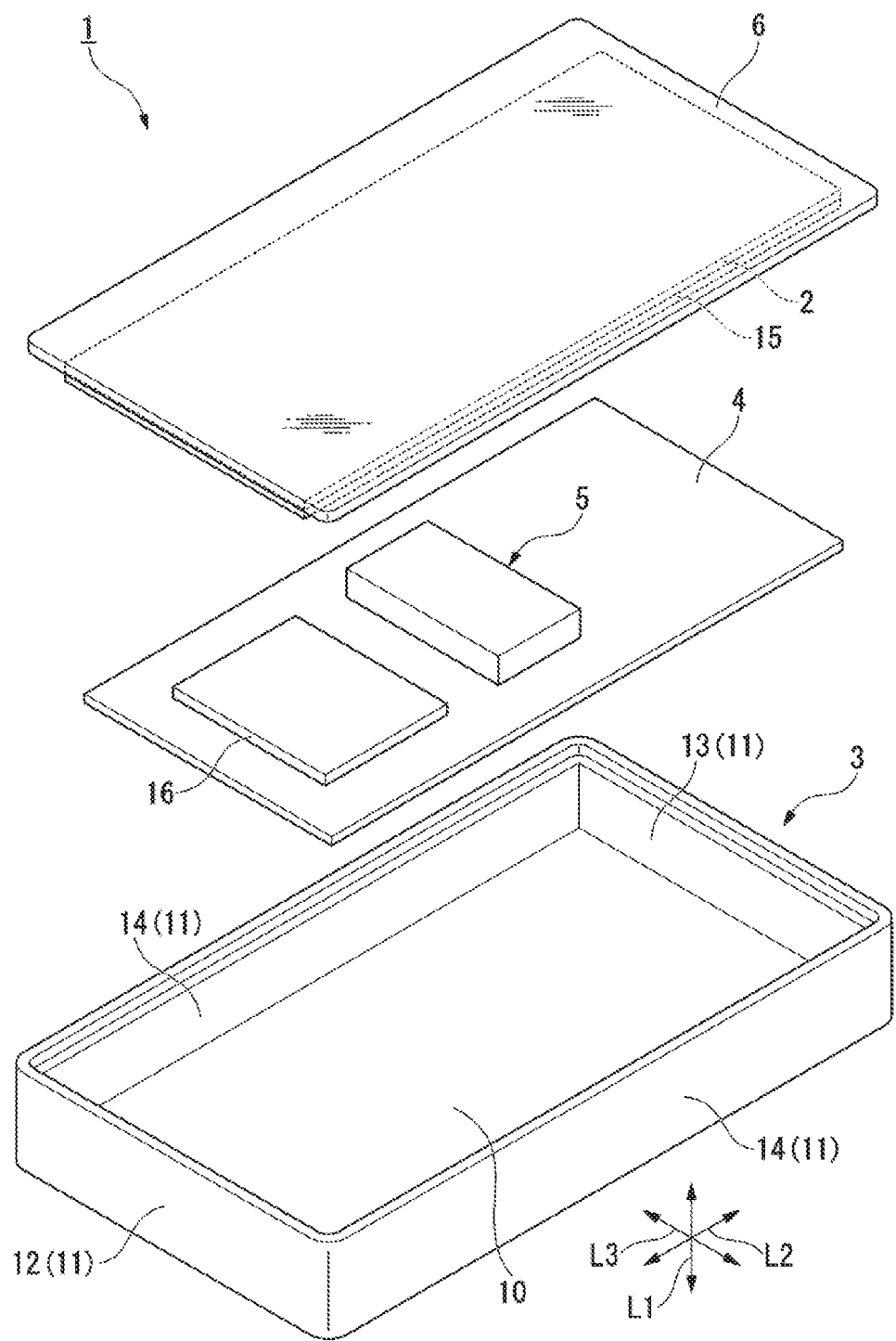
FIG. 2 is an exploded perspective view showing the portable information terminal shown in FIG. 1.
Figure 3:
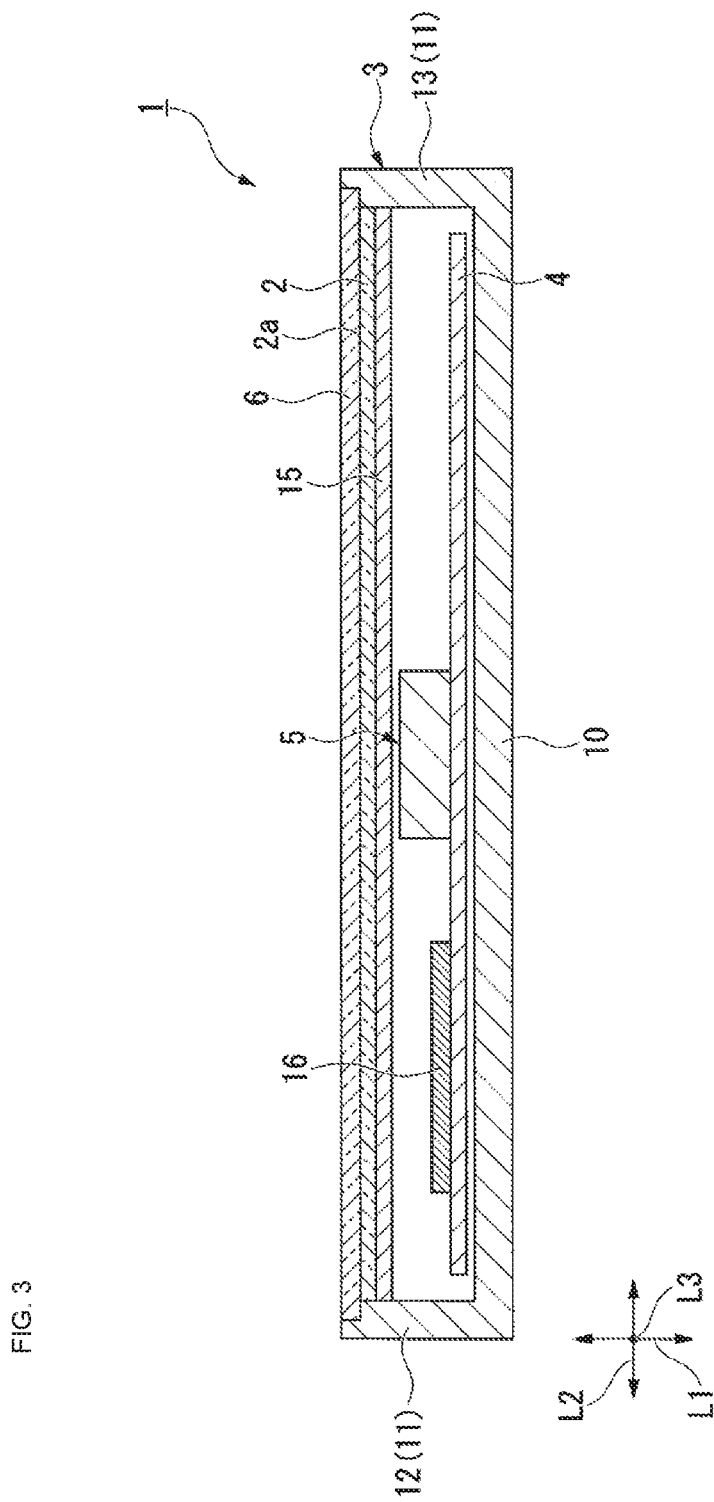
FIG. 3 is a longitudinal sectional view showing the portable information terminal taken along line A-A shown in FIG. 1.

As shown in FIGS. 1 to 3, a portable information terminal 1 according to the present embodiment includes a casing 3 having a touch panel 2 (operation panel according to the present invention) operated with a fingertip, a control board 4 housed in the casing 3, and an inertial force imparting device 5 housed in the casing 3 and mounted on the control board 4.

In addition, in FIGS. 2 and 3, the illustrations of the inertial force imparting device 5 are simplified.

In the present embodiment, two directions orthogonal to each other with respect to a thickness direction L1 of the casing 3 in a plan view of the casing 3 are referred to as a first direction L2 and a second direction L3. Accordingly, the first direction L2 and the second direction L3 are orthogonal directions orthogonal to the thickness direction L1 of the casing 3.

The casing 3 is formed in a rectangular shape in a plan view in which a length along the first direction L2 is longer than a length along the second direction L3, and is formed in a bottomed cylindrical shape with a small thickness. A protective cover 6, which is disposed to overlap the casing 3 in the thickness direction L1, is integrally combined with the casing 3. An opening of the casing 3 is closed with the protective cover 6.

In the thickness direction L1, the direction from a bottom wall portion 10 of the casing 3 toward the protective cover 6 is referred to as an upward direction, and the opposite direction is referred to as a downward direction.

The casing 3 is formed in the bottomed cylindrical shape having the bottom wall portion 10 and four peripheral wall portions 11 surrounding the bottom wall portion 10 and protruding upward from the bottom wall portion 10, and opens upward. Among the four peripheral wall portions 11, a pair of peripheral wall portions 11 facing each other in the first direction L2 are referred to as a front wall portion 12 and a rear wall portion 13, and a pair of peripheral wall portions 11 facing each other in the second direction L3 are referred to as side wall portions 14.

The casing 3 is not necessarily a single component, and may be configured by integrally combining a plurality of components, for example.

The protective cover 6 is a thin transparent cover such as glass, and is integrally combined with the casing 3 to close the opening of the casing 3 from above. At this time, predetermined dustproofness and waterproofness are provided between the protective cover 6 and the casing 3. Thereby, the inside of the casing 3 is in a sealed state.

In addition, the material of the protective cover 6 is not limited to glass, and for example, a transparent synthetic resin (an acrylic resin, a polycarbonate resin, and the like) may be utilized and may be suitably selected.

The control board 4 is, for example, a printed board on which various electronic components (not shown) for operating the portable information terminal 1 are mounted, with circuit patterns (not shown) formed on both surfaces, and is formed in a rectangular shape in a plan view in which the length along the first direction L2 is longer than the length along the second direction L3, corresponding to the shape of the casing 3. The control board 4 is stably supported in the casing 3 by a support member (not shown).

The touch panel 2 is disposed below the protective cover 6 to overlap the protective cover 6. The touch panel 2 is a thin transparent panel formed of a synthetic resin material or a glass material, and has a known contact detection function such as resistive membrane method, a capacitive sensing method, optical method, and so on. Thereby, the touch panel 2 can detect a location touched with the fingertip through the protective cover 6. Therefore, an upper surface 2a of the touch panel 2 is an operation surface operated by the fingertip of the operator or the like through the protective cover 6, that is, a so-called tactile sensation presenting surface.

A display panel 15 is disposed below the touch panel 2 to overlap the touch panel 2. The display panel 15 is a liquid crystal display device such as a liquid crystal display (LCD), for example, and can display various information through the touch panel 2 and the protective cover 6. Accordingly, when the fingertip touches the touch panel 2 through the protective cover 6 in response to various information displayed on the display panel 15, an input signal (command signal) based on the operation content corresponding to the touched location is sent to a control unit 16.

The control unit 16 is a CPU or the like that comprehensively controls the portable information terminal 1 and is mounted on the control board 4. Furthermore, various storage units such as a flash memory, a small speaker, a small microphone, a small camera, and the like are mounted on the control board 4. The storage unit, speaker, microphone, camera, and the like are not shown in the drawings.

In particular, the control unit 16 controls the display on the display panel 15 based on the input signal accompanying the operation of the touch panel 2. Further, the control unit 16 applies a predetermined voltage to a shape memory alloy wire 61 to be described below through a connection terminal 62 to be described below based on the operation of the touch panel 2 to control the energization of the shape memory alloy wire 61.

Further, in the casing 3, a power supply (not shown) for supplying power to various components is provided, and a removable memory card (not shown) and the like are provided. In addition, the power supply may be a chargeable and dischargeable secondary battery and the like, for example.

(Inertial Force Imparting Device)

Figure 4:
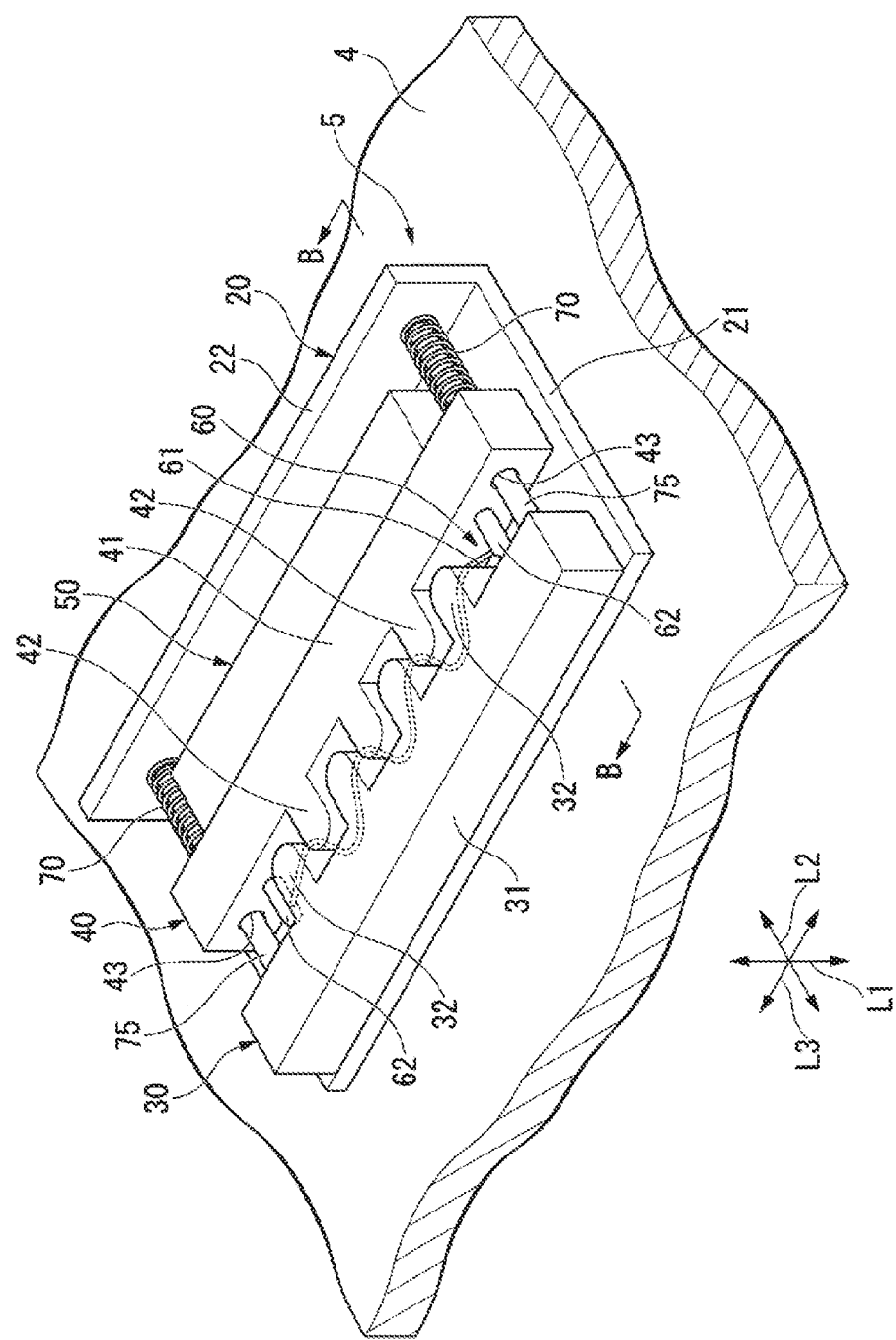
FIG. 4 is a perspective view showing the inertial force imparting device shown in FIG. 2.
Figure 5:
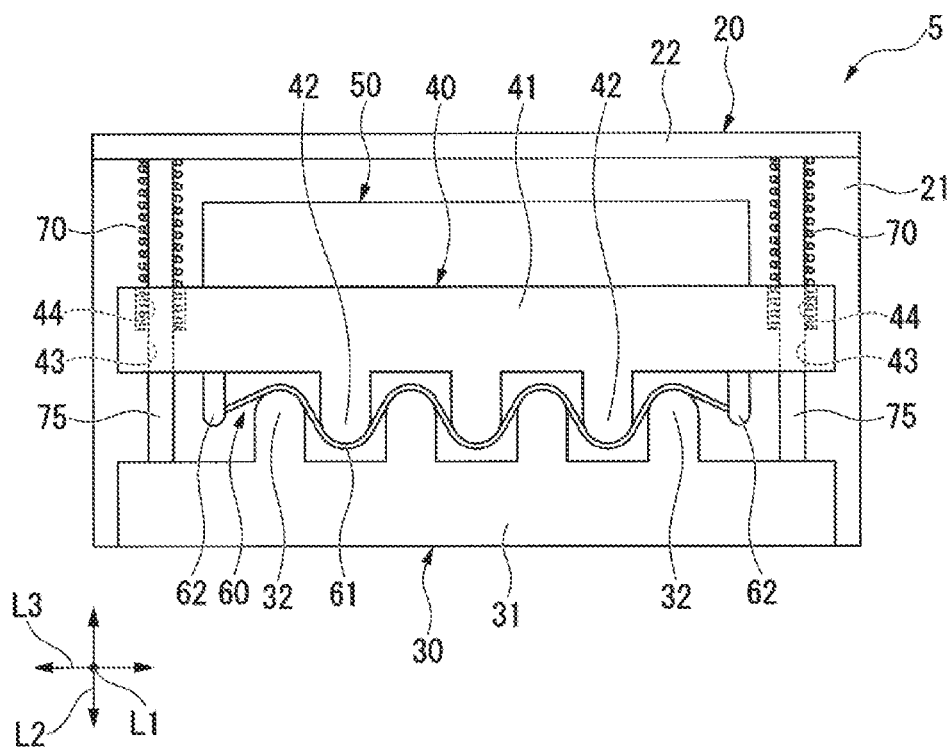
FIG. 5 is a top view showing the inertial force imparting device shown in FIG. 4.
Figure 6:
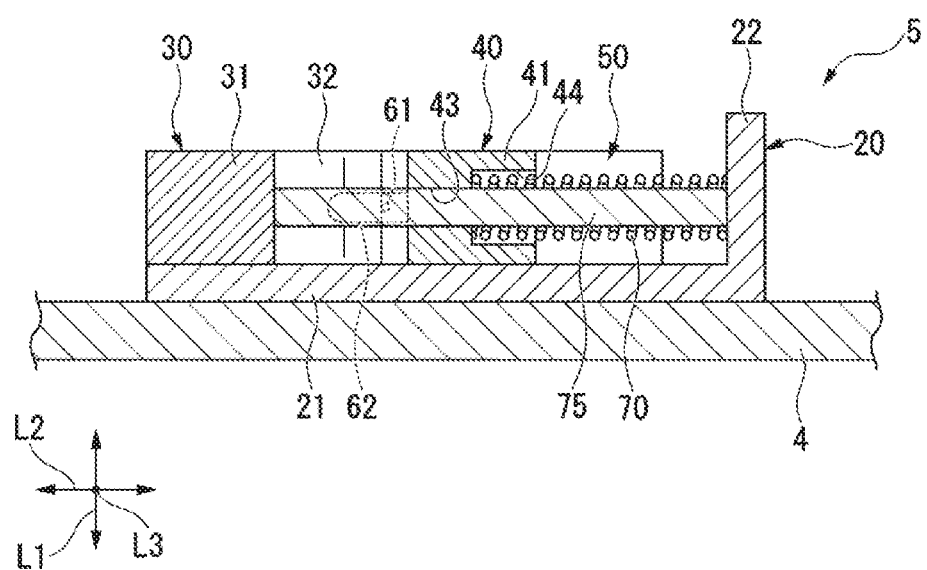
FIG. 6 is a longitudinal sectional view showing the inertial force imparting device taken along line B-B shown in FIG. 4.

As shown in FIGS. 4 to 6, the inertial force imparting device 5 is mounted on an upper surface of a central portion of the control board 4. However, the present invention is not limited to this example, and for example, the inertial force imparting device 5 may be mounted on a lower surface side of the control board 4. The control board 4 is not shown in FIG. 5.

The inertial force imparting device 5 includes a base table 20, a stator 30 fixed to the base table 20, a mover 40 mounted on the base table 20 to be relatively movable in the first direction L2 which is a movable direction with respect to the stator 30, a weight 50 attached to the mover 40, an actuator unit 60 that instantaneously displaces the mover 40 in the first direction L2 and delivers an inertial force (thrust) to the casing 3 based on the displacement, a coil spring 70 (an elastic member according to the present invention) that biases the mover 40 toward the stator 30 side along the first direction L2, and a guide rod 75 (a guide member according to the present invention) that guides the mover 40 to be movable in the first direction L2.

The base table 20 includes a base plate 21 mounted on the upper surface of the control board 4 and a back plate 22 extending upward from the base plate 21, and is formed in an L shape in a side view. However, the shape of the base table 20 is not limited to the above example, and may be changed as appropriate.

The base plate 21 is formed in a rectangular shape in a plan view in which a length along the first direction L2 is shorter than a length along the second direction L3, and is fixed to the upper surface of the control board 4 so as not to be moved. However, the shape of the base plate 21 is not limited to this example, and for example, may be formed in a rectangular shape in a plan view, in which the length along the first direction L2 is longer than the length along the second direction L3.

The back plate 22 is formed on a rear end side of the base plate 21 positioned on the rear wall portion 13 side of the casing 3 and is erected to rise vertically with respect to the base plate 21. The length of the back plate 22 along the second direction L3 is equal to the length of the base plate 21 along the second direction L3.

In addition, the inertial force imparting device 5 according to the present embodiment has a configuration in which the stator 30, the mover 40, the actuator unit 60, the coil spring 70, and the guide rod 75 are arranged on the upper surface of the base plate 21, respectively. Therefore, the inertial force imparting device 5 may be configured such that, for example, a cover member (not shown) that covers the base table 20 from above is integrally combined with the base table 20 so as to house therein the stator 30, the mover 40, the actuator unit 60, the coil spring 70 and the guide rod 75.

The stator 30 is fixed to the upper surface of the base plate 21, and on a front end side that is located on the front wall portion 12 side of the casing 3.

The stator 30 includes a base 31 that extends along the second direction L3 and is shorter than the base plate 21, and a plurality of protrusions 32 that protrude from the base 31 toward the mover 40 side. The plurality of protrusions 32 are arranged at constant intervals in the second direction L3 and are formed to protrude toward the mover 40 side by a predetermined amount of protrusion. A tip of each protrusion 32 is formed in a rounded shape, for example, in an arc shape in a plan view.

In the illustrated example, the stator 30 has four protrusions 32, but the number of protrusions 32 is not limited to this example.

The guide rod 75 is attached between the stator 30 and the back plate 22.

Specifically, there are guide rods 75 formed in a columnar shape extending in the first direction L2, and respectively disposed at both ends of the base 31 in the second direction L3. Therefore, a pair of guide rods 75 are disposed with the plurality of protrusions 32 interposed therebetween. The guide rods 75 are integrally combined with the base 31 and the back plate 22 with a gap with respect to the upper surface of the base plate 21.

The mover 40 is mounted on the upper surface of the base plate 21 to be slidable in the first direction L2, and is disposed to face the stator 30 in the first direction L2.

The mover 40 includes a base 41 extending along the second direction L3 and a plurality of protrusions 42 protruding from the base 41 toward the stator 30 side. The length of the base 41 along the second direction L3 is equal to the length of the base 31 in the stator 30.

The plurality of protrusions 42 are arranged at constant intervals in the second direction L3 and are formed to protrude toward the stator 30 side by a predetermined amount of protrusion. The tip of each protrusion 42 is formed in a rounded shape, for example, an arc shape in a plan view, like the stator 30 side.

In the illustrated example, the mover 40 has three protrusions 42, but the number of protrusions 42 is not limited to this example.

The interval between the protrusions 32 on the stator 30 side and the interval between the protrusions 42 on the mover 40 side are the same interval (pitch) as each other. Further, the amount of protrusion of each protrusion 32 on the stator 30 side and the amount of protrusion of each protrusion 42 on the mover 40 side are equal to each other. The stator 30 and the mover 40 are arranged to face each other so that the protrusions 32 on the stator 30 side enter between the protrusions 42 on the mover 40 side, respectively. Thereby, the protrusions 42 on the mover 40 side and the protrusions 32 on the stator 30 side are arranged in a comb-like shape.

In the base 41 of the mover 40, guide holes 43 penetrating the base 41 in the first direction L2 are formed at both ends in the second direction L3 with the plurality of protrusions 42 interposed therebetween. The mover 40 is slidably mounted on the upper surface of the base plate 21 in a state where the guide rods 75 inserted through the guide holes 43, respectively. Accordingly, the mover 40 is movable in a straight line with less rattling in the first direction L2 while being guided by the guide rods 75 in the first direction L2.

Further, a housing recess 44 that is recessed toward the stator 30 side is formed in continuity with the guide hole 43, on the rear surface side of the base 41 facing the back plate 22. The housing recess 44 is formed in a circular shape that is larger in diameter than the guide hole 43 in a rear view when viewed from the back plate 22 side, and is formed coaxially with the guide hole 43.

The actuator 60 includes a shape memory alloy wire 61 that is disposed between the stator 30 and the mover 40 and has a length that varies with temperature.

The shape memory alloy wire 61 is a nickel-titanium alloy wire, for example, and is interposed in a wave shape between each protrusion 42 on the mover 40 side and each protrusion 32 on the stator 30 side. The material of the shape memory alloy wire 61 is not limited to the nickel-titanium alloy, and may be changed as appropriate.

Both ends of the shape memory alloy wire 61 are connected to connection terminals 62 provided on the base 41 of the mover 40. For example, the connection terminal 62 is formed to protrude from the base 41 toward the base 31 on the stator 30 side, and is formed to be positioned between the guide rod 75 and the protrusion 32 on the stator 30 side.

The connection terminal 62 is electrically connected to the circuit pattern (not shown) formed on the control board 4 through the mover 40 and the base table 20 so as to be conducted. Thereby, the shape memory alloy wire 61 is electrically connected to the control unit 16 mounted on the control board 4 through the connection terminal 62, and can be energized by an application of a predetermined voltage. It is noted that the connection terminal 62 serves as the part of the actuator unit 60.

Figure 7:
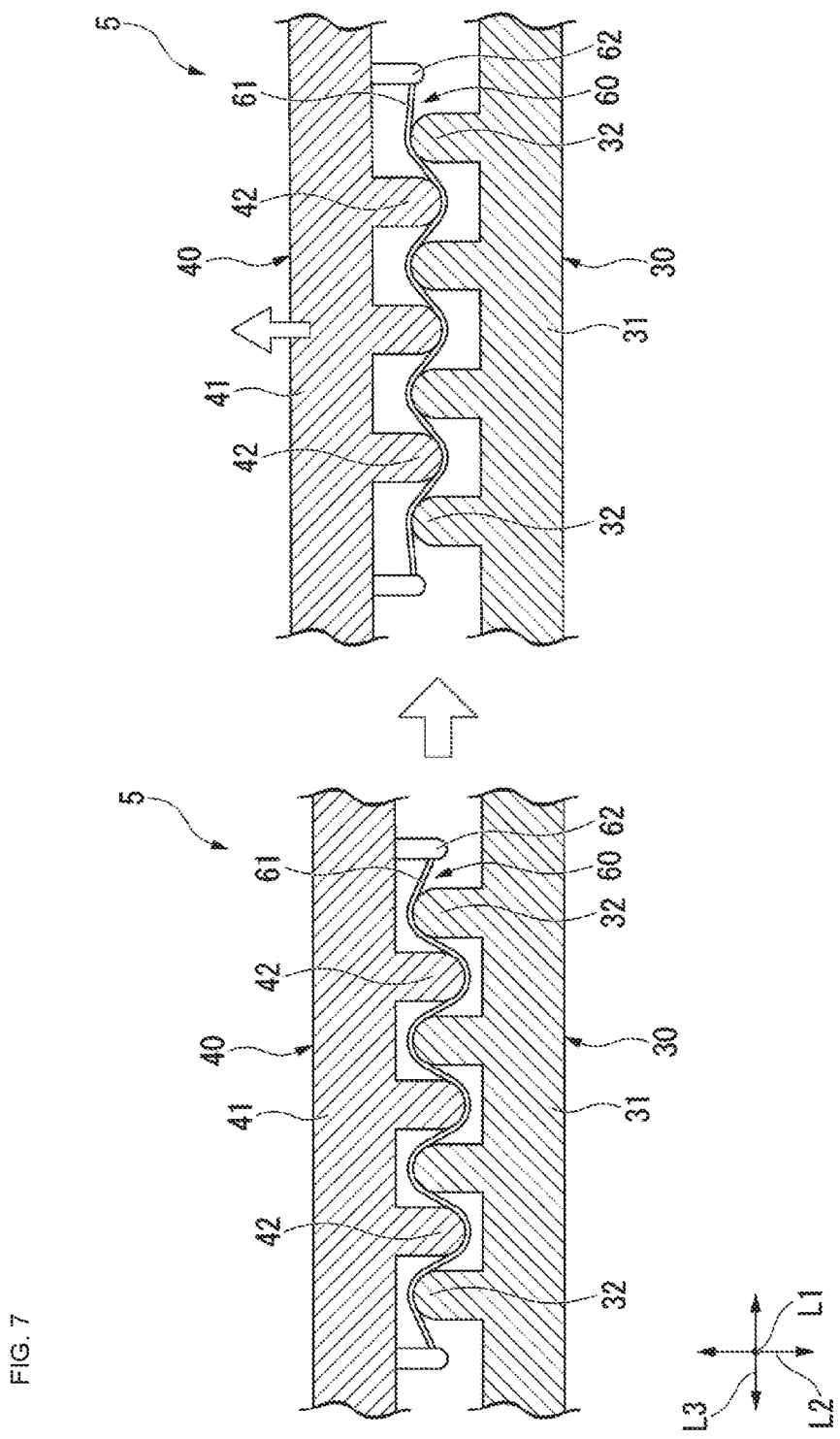
FIG. 7 is a view showing an operation of the actuator unit shown in FIG. 5.

The shape memory alloy wire 61 is instantaneously contracted by heating by the energization. As a result, as shown in FIG. 7, the shape memory alloy wire 61 shifts from the relaxed state to the stretched state, so that the mover 40 can be moved along the first direction L2 which is the movable direction so as to be separated away from the stator 30. As described above, the shape memory alloy wire 61 can change the interval between the mover 40 and the stator 30 by the expansion and contraction accompanying the energization heating.

The stator 30 and the mover 40 described above are formed of a material having a higher thermal conductivity than that of the shape memory alloy wire 61. Specifically, the stator 30 and the mover 40 are formed of an aluminum material, and an anodic oxide film serving as an insulating film is formed on surfaces thereof by anodizing treatment or the like. Accordingly, the stator 30 and the mover 40 are arranged in contact with the shape memory alloy wire 61 and serve as a heat radiation body (heat transfer body according to the present invention) that radiates the heat of the shape memory alloy wire 61.

Although an aluminum material subjected to anodizing treatment has been described as an example of the material having a thermal conductivity higher than that of the shape memory alloy wire 61, the present invention is not limited to this example, and for example, other metal materials may be used, and a synthetic resin or the like may be employed.

As shown in FIGS. 4 to 6, the weight 50 is formed in a rectangular parallelepiped shape (block shape) extending along the second direction L3, and is fixed to the rear surface of the base 41 of the mover 40 by adhesion, welding, or the like. As a result, the weight 50 is integrally combined with the mover 40 and is movable together with the mover 40 in the first direction L2 according to expansion and contraction of the shape memory alloy wire 61.

The weight 50 has the same thickness as the base 41 of the mover 40 and is disposed between the pair of guide rods 75. Further, the weight 50 is disposed at an appropriate interval from the back plate 22. Thereby, the weight 50 is prevented from contact with the back plate 22 during the movement in the first direction L2 accompanying the expansion and contraction of the shape memory alloy wire 61.

The material of the weight 50 is not particularly limited, and for example, tungsten that is a metal material having a large specific gravity can be suitably used. However, the material of the weight 50 is not limited to this example, and may be formed of other metal materials. It is preferable to use a metal material having a large specific gravity and excellent workability.

The coil springs 70 are disposed in a compressed state between the base 41 of the mover 40 and the back plate 22 in a state where each of the coil springs 70 is externally inserted into the pair of guide rods 75. One end of the coil spring 70 is housed in the housing recess 44 formed in the base 41, and the other end side of the coil spring 70 is in contact with the back plate 22. Accordingly, the coil spring 70 biases the mover 40 toward the stator 30 side using an elastic restoring force (biasing force).

Since the mover 40 is biased toward the stator 30 side as described above, the shape memory alloy wire 61 is in a state of being interposed between the mover 40 and the stator 30 as shown in FIG. 5. Further, the mover 40 biased by the coil spring 70 is restrained from being further displaced toward the stator 30 side by the shape memory alloy wire 61, and is in a state of being positioned as shown in FIG. 5.

(Operation of Portable Information Terminal)

The operation when using the portable information terminal 1 including the inertial force imparting device 5 configured as described above will be described below.

In this case, as shown in FIG. 1, when the touch panel 2 is operated with a fingertip through the protective cover 6 while the information displayed on the display panel 15 is visually recognized through the touch panel 2 and the protective cover 6, the operation corresponding to a touched location can be performed. As a result, various functions of the portable information terminal 1 can be utilized suitably.

In particular, by operating the touch panel 2 through the protective cover 6, the actuator unit 60 in the inertial force imparting device 5 can be used to instantaneously displace the mover 40 to which the weight 50 is attached, and thus, the mover 40 can be moved in the casing 3, for example, at a predetermined acceleration along the first direction L2 which is the movable direction. Thereby, the inertia force (thrust) of the mover 40 and the weight 50 can be delivered to the entire casing 3 based on the displacement of the mover 40. Therefore, it is possible to simulatively deliver a kinetic operation feeling to the fingertip touching on the touch panel 2, and it is also possible to deliver a tactile sensation as if giving a click feeling to the fingertip.

This will be described in more detail.

Figure 8:
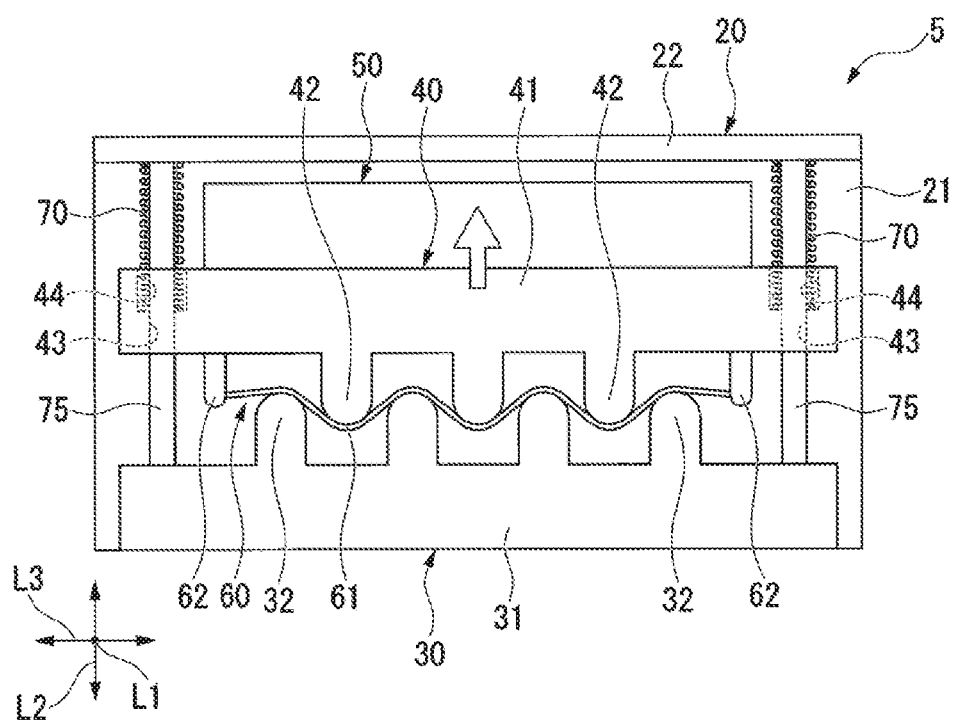
FIG. 8 is a top view showing the inertial force imparting device in a state in which the mover is moved away from the stator from the state shown in FIG. 5.

When the touch panel 2 is operated by the fingertip through the protective cover 6, the control unit 16 energizes the shape memory alloy wire 61 through the connection terminal 62. Thereby, the shape memory alloy wire 61 can be heated and contracted instantaneously. For this reason, the shape memory alloy wire 61 shown in FIG. 5 interposed between each protrusion 32 of the stator 30 and each protrusion 42 of the mover 40 can be changed from a relaxed state to a stretched state as shown in FIG. 8, and accordingly, the mover 40 can be separated away from the stator 30 against the elastic restoring force (biasing force) of the coil spring 70.

As a result, it is possible to instantaneously move the mover 40 to which the weight 50 is attached along the first direction L2 which is the movable direction with respect to the casing 3 while elastically deforming the coil spring 70. Therefore, the inertia force (thrust) of the mover 40 and the weight 50 can be delivered to the entire casing 3, and a tactile sensation as if giving a click feeling can be delivered to the fingertip touching on the touch panel 2.

Furthermore, by radiating the heat generated by energization heating from the shape memory alloy wire 61, the shape memory alloy wire 61 can be expanded instantaneously, for example, and can be shifted from a stretched state to a relaxed state.

At this time, the mover 40 is biased to approach toward the stator 30 side by an elastic restoring force (biasing force) of the coil spring 70. Therefore, with the expansion of the shape memory alloy wire 61, the mover 40 can be reliably approached toward the stator 30 side using the biasing force of the coil spring 70. Therefore, the mover 40 to which the weight 50 is attached can be instantaneously moved in the reverse direction along the first direction L2 which is the movable direction, and can be returned to the state shown in FIG. 5. At the time of this return, a tactile sensation as if giving a click feeling can be delivered to the fingertip touching on the touch panel 2 in the same manner as before.

Therefore, it is possible to vibrate the mover 40 in the first direction L2 by using the expansion and contraction of the shape memory alloy wire 61. In particular, an impulse-like vibration can be generated, such as, for example, a tactile sensation close to that of a mechanical switch can be delivered, or a tactile sensation different from that of a vibration motor or the like can be delivered. Furthermore, the shape memory alloys generally have excellent reproducibility and responsiveness of expansion and contraction, and thus, it is possible to stably provide a tactile sensation as if giving a click feeling at the moment the fingertip touches the touch panel 2.

Furthermore, in the portable information terminal 1 according to the present embodiment, with the inertial force imparting device 5 being housed in the casing 3, the inertial force of the mover 40 and the weight 50 can be delivered to the entire casing 3. Therefore, for example, it is not necessary to provide a gap between the touch panel 2 and the protective cover 6 and the casing 3, which is otherwise required in the related art, and even when the inside of the casing 3 is kept sealed, a tactile sensation as if giving a click feeling can be delivered to the fingertip touching on the touch panel 2. For this reason, it is also possible to prevent dust or moisture from intruding into the casing 3.

Therefore, as there is no need for a special dustproof and waterproof structure or the like, the casing 3 can be sealed with a simple structure, and it allows use for various applications without being restricted by the use environment. Therefore, it is excellent in usability and can be suitably used as the portable information terminal 1.

Further, it is also possible to vibrate the casing 3, for example, by displacing the mover 40 as necessary and separately from the operation of the operator. As a result, it possible to notify the operator of incoming calls or mail, for example, and there is no need to provide a dedicated vibration source (for example, a vibration motor or the like). Therefore, the configuration can be simplified and the cost can be reduced.

As described above, with the inertial force imparting device 5 and the portable information terminal 1 according to the present embodiment, it is possible to prevent intrusion of dust, moisture, and the like, and simulatively deliver a kinetic operation feeling in response to the operation of the operator, and generate vibrations as necessary and separately from the operation of the operator.

Further, since the stator 30 and the mover 40 also serve as a heat radiation body that radiates heat of the shape memory alloy wire 61, the heat of the shape memory alloy wire 61 can be efficiently radiated, and the temperature of the shape memory alloy wire 61 heated by the energization heating can be quickly lowered. As a result, the shape memory alloy wire 61 can be provided with good heat radiation characteristics, and the responsiveness to the expansion and contraction operation can be enhanced. Therefore, a tactile sensation can be delivered to the fingertip with a better response.

In the present embodiment, the instantaneous displacement of the mover 40 according to the expansion and contraction of the shape memory alloy wire 61 can be performed by moving the mover 40 at a speed of 4 m/s to 8 m/s and with a displacement of 50 μm to 10 μm, for example. The energization time for the shape memory alloy wire 61 is several ms to several tens of ms, for example, and the contraction rate of the shape memory alloy wire 61 according to energization is several %, for example.

Furthermore, since the shape memory alloy wire 61 is electrically connected to the control unit 16 through the connection terminal 62, it is possible to easily energize the shape memory alloy wire 61, which can lead to simplification of the configuration. In addition, since the mover 40 can be moved smoothly with less rattling along the first direction L2 by using the pair of guide rods 75, it is easy to ensure that the desired tactile sensation is delivered to the fingertip.

Second Embodiment

Next, a second embodiment according to the present invention will be described with reference to the drawings. In the second embodiment, the same parts as those of the first embodiment are denoted by the same reference numerals, and the description thereof is omitted.

In the first embodiment, the weight 50 is disposed between the mover 40 and the back plate 22, but in the present embodiment, at least a portion of the weight is attached to the mover 40 to have an overlapping positional relationship with the mover 40, the shape memory alloy wire 61, and the stator 30 in the thickness direction L1 which is an orthogonal direction orthogonal to the first direction L2 (movable direction).

Figure 9:
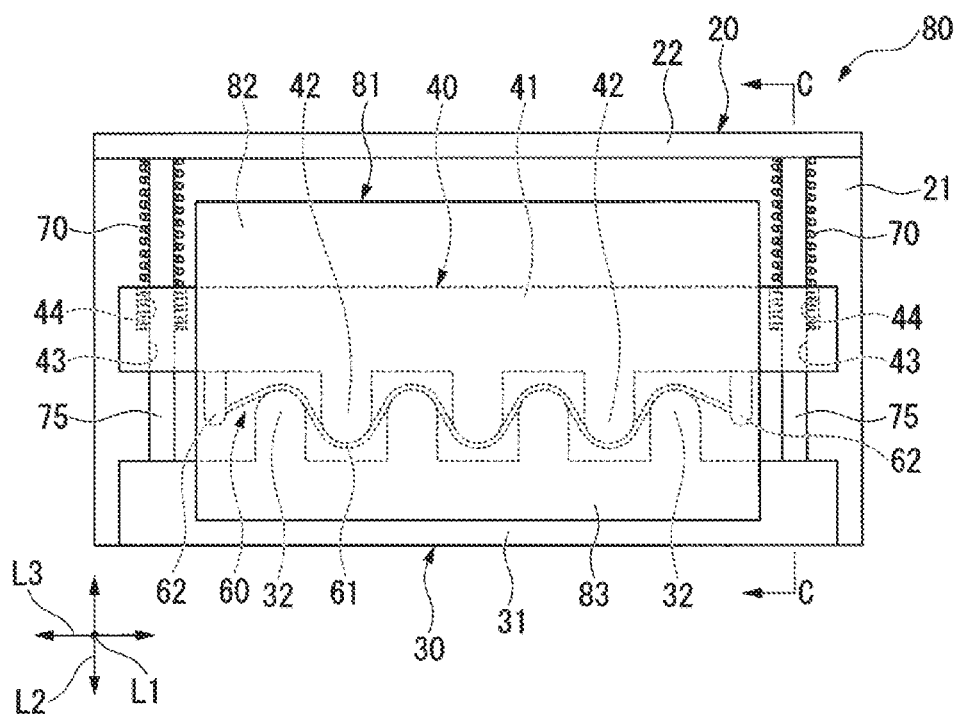
FIG. 9 is a top view showing an inertial force imparting device according to a second embodiment of the present invention.
Figure 10:
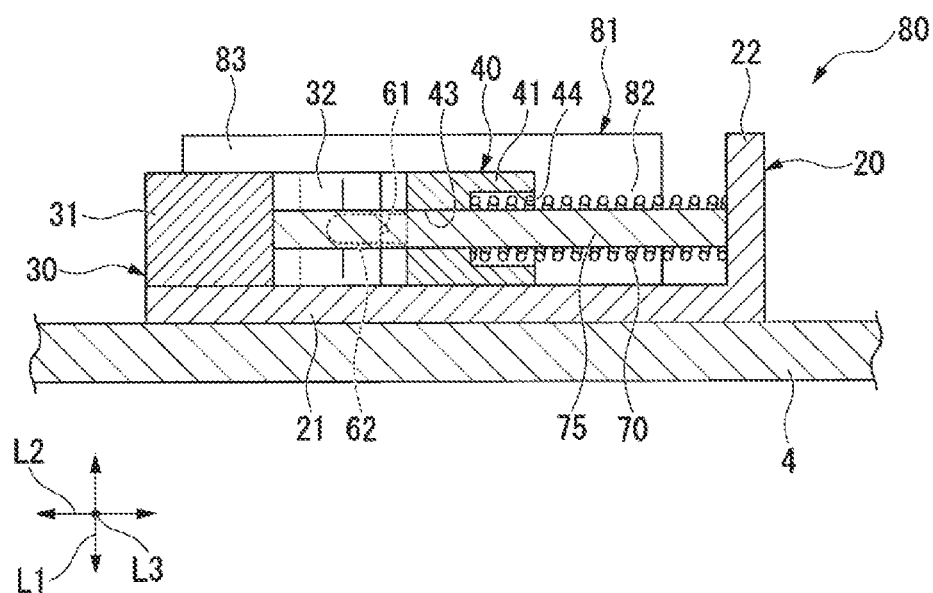
FIG. 10 is a longitudinal sectional view showing the inertial force imparting device taken along line C-C shown in FIG. 9.

As shown in FIGS. 9 and 10, in an inertial force imparting device 80 according to the present embodiment, a weight 81 is formed in an L shape in a side view. The weight 81 includes a first weight portion 82 fixed to the rear surface of the base 41 of the mover 40, and a second weight portion 83 that is integrally formed with the first weight portion 82 and protrudes from the first weight portion 82 toward the stator 30 side. The control board 4 is not shown in FIG. 9.

The first weight portion 82 is formed in a rectangular parallelepiped shape extending along the second direction L3, and is fixed to the rear surface of the base 41 by adhesion, welding, or the like, in a state of being disposed between the pair of guide rods 75. The first weight portion 82 is formed to protrude above the mover 40.

The second weight portion 83 is formed in a rectangular shape in a plan view with the length along the second direction L3 longer than the length along the first direction L2, and is integrally connected to an upper end of the first weight portion 82 protruding above the mover 40, in a state of being disposed in parallel to the base plate 21.

Thus, the second weight portion 83 is disposed to cover a portion of the mover 40, and a portion of the shape memory alloy wire 61 and the stator 30 from above. The length of the second weight portion 83 along the second direction L3 is equal to the length of the first weight portion 82 along the second direction L3.

Since the weight 81 is configured as described above, the weight 81 is attached to the mover 40 such that the second weight portion 83 has an overlapping positional relationship with the mover 40, the shape memory alloy wire 61, and the stator 30 in the thickness direction L1.

(Operation of Inertial Force Imparting Device)

In the case of the inertial force imparting device 80 configured as described above, the same operational effects as those of the first embodiment can be achieved.

In addition, in the case of the present embodiment, since the weight 81 can be designed in an increased size by the presence of the second weight portion 83, the weight 81 can be made heavier than in the case of the first embodiment. Therefore, a greater inertial force can be delivered to the casing 3 by the instantaneous movement of the mover 40, and a tactile sensation as if giving a clearer click feeling is effectively delivered to the fingertip of the operator.

Moreover, since the weight 81 is fixed to the mover 40 so that the second weight portion 83 overlaps with the mover 40, the shape memory alloy wire 61 and the stator 30 in the thickness direction L1, the weight 81, the mover 40, the shape memory alloy wire 61 and the stator 30 can be compactly arranged in the first direction L2, and the size of the entire inertial force imparting device 80 can be prevented from increasing in the first direction L2.

Therefore, according to the inertial force imparting device 80 of the present embodiment, the weight 81 can be made heavier while the overall size is prevented from increasing in the first direction L2.

Third Embodiment

Next, a third embodiment according to the present invention will be described with reference to the drawings. In the third embodiment, the same parts as those of the first embodiment are denoted by the same reference numerals, and the description thereof is omitted.

In the first embodiment, both the guide rod 75 and the coil spring 70 are provided, but in the present embodiment, a leaf spring member is provided with a function of guiding the mover 40 to be movable in the first direction L2. Therefore, the guide rod 75 is not provided in the present embodiment.

Figure 11:
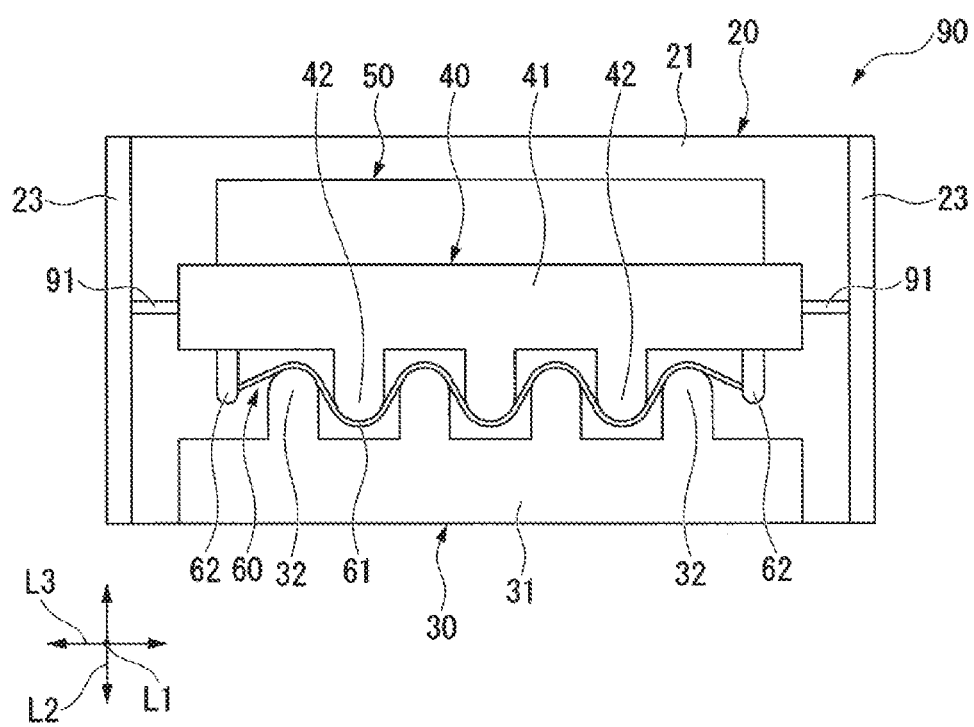
FIG. 11 is a top view showing an inertial force imparting device according to a third embodiment of the present invention.
Figure 12:
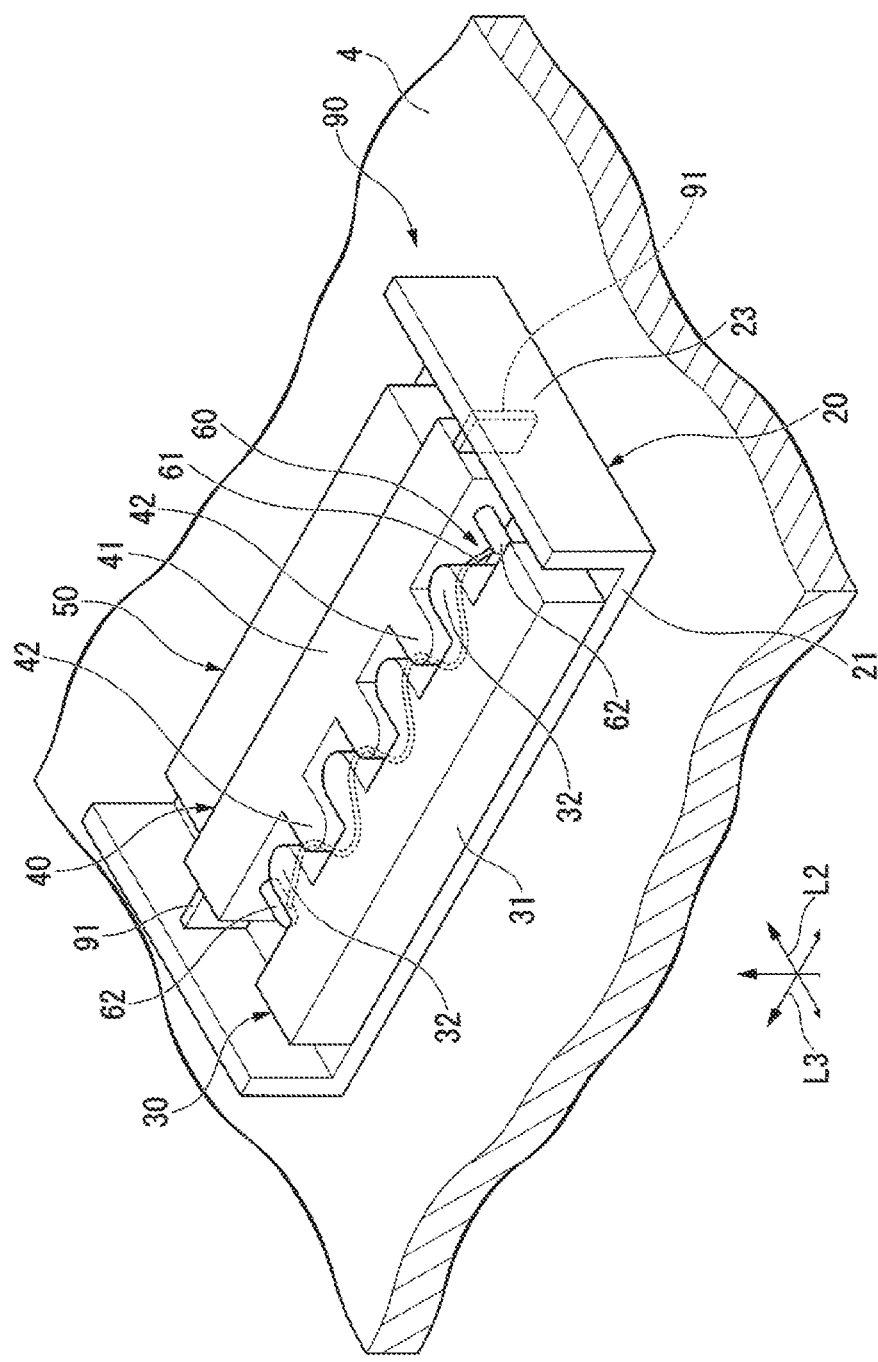
FIG. 12 is a perspective view showing the inertial force imparting device shown in FIG. 11.

As shown in FIGS. 11 and 12, an inertial force imparting device 90 according to the present embodiment includes the base table 20 having a pair of side plates 23. The control board 4 is not shown in FIG. 11.

The pair of side plates 23 are respectively formed on the side ends of the base plate 21 positioned on the side wall portion 14 side of the casing 3, and are erected to rise vertically from the base plate 21. Thereby, the pair of side plates 23 are arranged to face each other in the second direction L3. The length of the side plate 23 along the first direction L2 is equal to the length of the base plate 21 along the first direction L2.

The base table 20 according to the present embodiment does not include the back plate 22 according to the first embodiment. However, the present invention is not limited to this example, and the base table 20 may further include the back plate 22 in addition to the pair of side plates 23.

A leaf spring member (elastic member according to the present invention) 91 that biases the mover 40 to approach toward the stator 30 side in the first direction L2 is arranged between the pair of side plates 23 and the mover 40.

The leaf spring member 91 is formed with a thickness equivalent to that of the base 41 of the mover 40, for example, and is formed in a plate-like shape having a width along the first direction L2 smaller than the thickness. The leaf spring member 91 includes one end connected to the side plate 23 and the other end connected to the side surface of the base 41 facing the side plate 23. Further, the leaf spring member 91 constantly biases the mover 40 toward the stator 30 side using an elastic restoring force (biasing force).

In particular, the leaf spring member 91 is formed such that the elastic modulus in the first direction L2 that is the movable direction is lower than the elastic modulus in the orthogonal direction orthogonal to the first direction L2, that is, the second direction L3 and the thickness direction L1, and also has a function of guiding the mover 40 to be movable along the first direction L2 which is the movable direction due to the difference in elastic modulus.

(Operation of Inertial Force Imparting Device)

In the case of the inertial force imparting device 90 configured as described above, the same operational effects as those of the first embodiment can be achieved.

In addition, in the case of the present embodiment, since the mover 40 can be moved smoothly with less rattling along the first direction L2 which is the movable direction by using the leaf spring member 91, it is easy to ensure that the desired tactile sensation is delivered to the fingertip. Furthermore, since it is not necessary to provide the guide rod 75, it is easy to simplify the configuration. Furthermore, the length of the mover 40 and the stator 30 along the second direction L3 can be shortened by the omission of the guide rod 75, thereby facilitating compactness of the entire inertial force imparting device 90.

Figure 13:
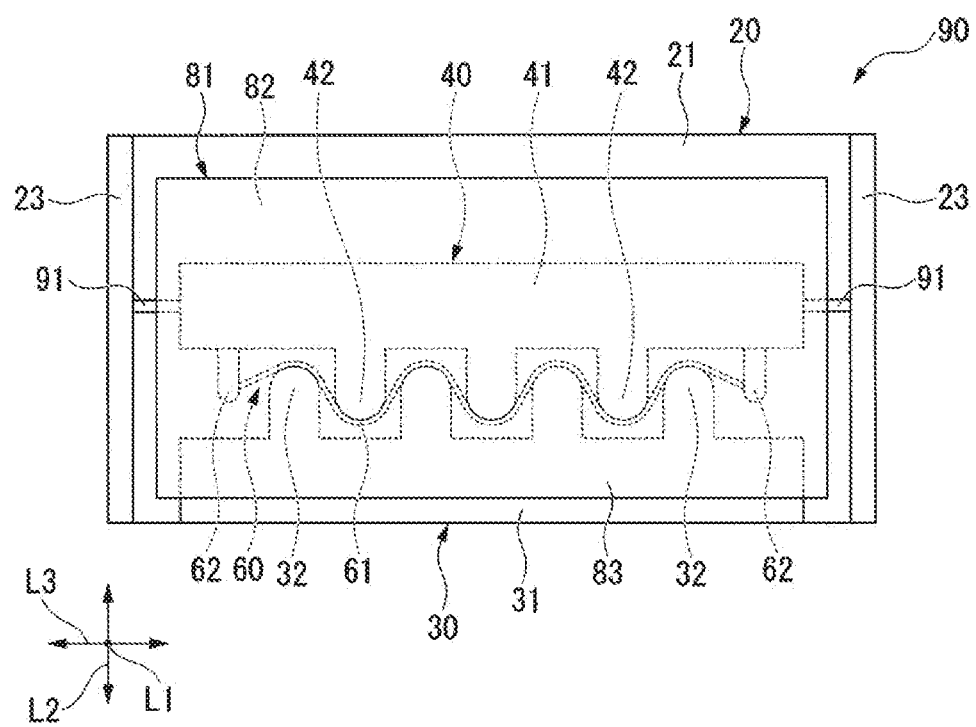
FIG. 13 is a top view showing an inertial force imparting device according to a modification of the third embodiment.

Similarly to the second embodiment, in the present embodiment, for example, as shown in FIG. 13, the weight 81 having an L shape in a side view including the first weight portion 82 and the second weight portion 83 may be used.

The first weight portion 82 is formed in a rectangular parallelepiped shape in which a length along the second direction L3 is longer than that of the mover 40. Accordingly, the second weight portion 83 is disposed to cover the leaf spring member 91 as well as a portion of the mover 40, and a portion of the shape memory alloy wire 61 and the stator 30 from above. Accordingly, the weight 81 is attached to the mover 40 to have a positional relationship in which the second weight portion 83 overlaps with the mover 40, the shape memory alloy wire 61, the stator 30, and the leaf spring member 91 in the thickness direction L1.

When the weight 81 is configured as described above, in addition to achieving the effect of the first embodiment, the weight 81 can also be designed in an increased size by the presence of the second weight portion 83, so that the weight 81 can be made heavier than in the example of the first embodiment. Therefore, a greater inertial force can be delivered to the casing 3 by the instantaneous movement of the mover 40, and a tactile sensation as if giving a clearer click feeling is effectively delivered to the fingertip of the operator.

Fourth Embodiment

Next, a fourth embodiment according to the present invention will be described with reference to the drawings. In the fourth embodiment, the same parts as those of the first embodiment are denoted by the same reference numerals, and the description thereof is omitted.

In the first embodiment, the mover 40 is moved in the first direction L2 along the plane of the control board 4, but in the present embodiment, the mover 40 is moved in the thickness direction L1 of the casing 3, which is the direction orthogonal to the control board 4.

Figure 14:
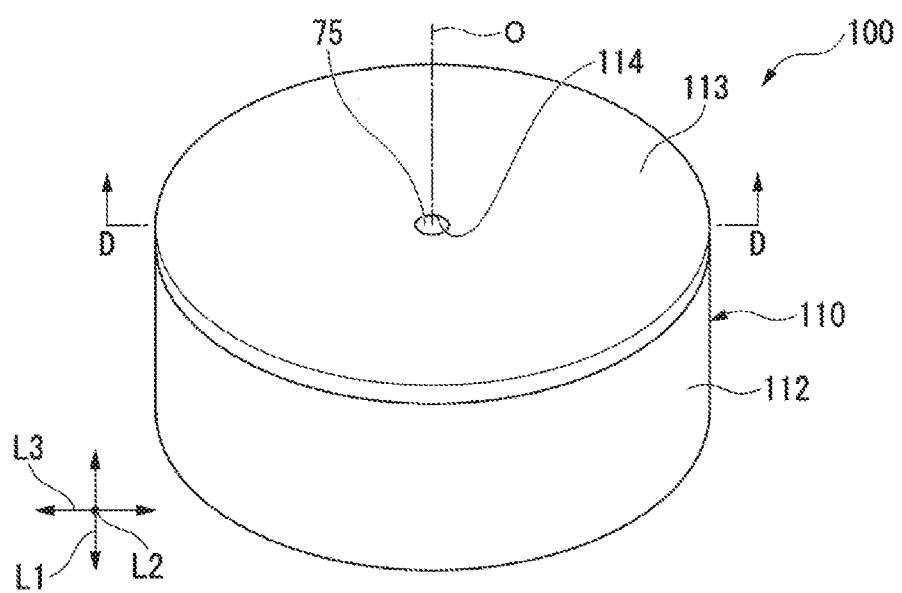
FIG. 14 is a perspective view showing an inertial force imparting device according to a fourth embodiment of the present invention.
Figure 15:
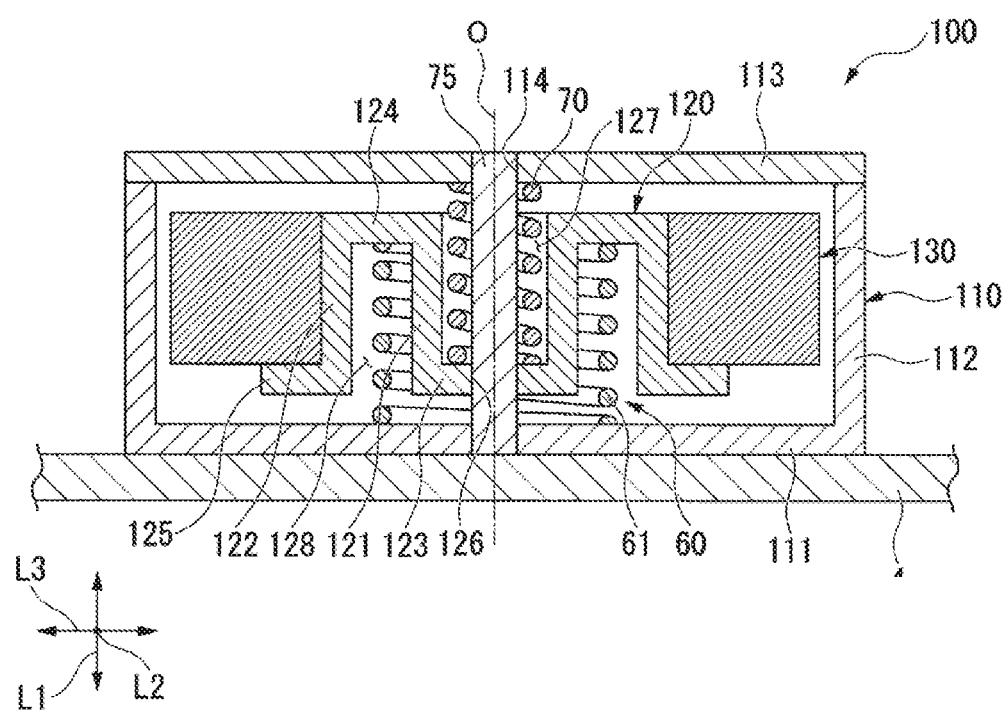
FIG. 15 is a longitudinal sectional view showing the inertial force imparting device taken along line D-D shown in FIG. 14.

As shown in FIGS. 14 and 15, an inertial force imparting device 100 according to the present embodiment includes a bottomed cylindrical stator 110 mounted on the upper surface of the control board 4, a mover 120 disposed to be movable relative to the stator 110 in the thickness direction L1 of the casing 3, a weight 130 attached to the mover 120, the actuator unit 60 having the shape memory alloy wire 61 provided between the stator 110 and the mover 120 and instantaneously displacing the mover 120 in the thickness direction L1 and delivering an inertial force (thrust) to the casing 3 based on the displacement, the coil spring 70 that biases the mover 120 toward the stator 110 side along the thickness direction L1, and the guide rod 75 that guides the mover 120 to be movable in the thickness direction L1. The control board 4 is not shown in FIG. 14.

The stator 110 is formed in a bottomed cylindrical shape with an axis O orthogonal to the control board 4 serving as a center. A direction intersecting the axis O in a plan view when viewed from the direction of the axis O is referred to as a radial direction and a direction around the axis O is referred to as a circumferential direction.

The stator 110 is formed in a bottomed cylindrical shape including a bottom wall portion 111 formed in a circular shape in a plan view and a peripheral wall portion 112 erected upward from an outer peripheral edge portion of the bottom wall 111 and opens upward. The guide rod 75 is erected at a central portion of the bottom wall portion 111 in a state of being in a coaxially arrangement with the axis O. The guide rod 75 slightly protrudes above the peripheral wall portion 112.

A cover plate 113 having a circular shape in a plan view is attached to an upper end of the peripheral wall portion 112 so as to close the opening of the peripheral wall portion 12 from above. Thereby, the inside of the stator 110 can be sealed, for example. A through-hole 114 penetrating the cover plate 113 in the thickness direction L1 is formed at the center portion of the cover plate 113. The cover plate 113 is attached to the upper end of the peripheral wall portion 112 in a state where the guide rod 75 is inserted into the through-hole 114. The upper end surface of the guide rod 75 is flush with the upper end surface of the cover plate 113.

The mover 120 is formed in a double cylinder shape and is housed inside the peripheral wall portion 112 of the stator 110 in a state of being in a coaxial arrangement with the axis O.

The mover 120 includes an inner cylinder 121 surrounding the guide rod 75 from the outside in the radial direction, an outer cylinder 122 further surrounding the inner cylinder 121 from the outside in the radial direction, a closing portion 123 having a circular shape in a plan view and closing a lower end opening of the inner cylinder 121, an annular connection ring 124 connecting an upper end of the inner cylinder 121 and an upper end of the outer cylinder 122 in the radial direction, and an annular flange portion 125 protruding radially outward from a lower end of the outer cylindrical portion 122.

A guide hole 126 penetrating the closing portion 123 in the thickness direction L1 is formed at a central portion of the closing portion 123. The mover 120 is housed inside the peripheral wall portion 112 in a state where the guide rod 75 is inserted through the guide hole 126. Therefore, the mover 120 is movable in a straight line in the thickness direction L1 while being guided by the guide rod 75.

The inner side of the inner cylinder 121 is a first housing portion 127 that opens upward. A space between the inner cylinder 121 and the outer cylinder 122 is an annular second housing portion 128 that opens downward.

The shape memory alloy wire 61 according to the present embodiment is formed in a spiral shape (coiled shape) with the axis O serving as the center, and is housed in the second housing portion 128 coaxially with the axis O. An upper end of the shape memory alloy wire 61 is in contact with the connection ring 124 of the mover 120 from below, and the lower end thereof is in contact with the bottom wall portion 111 of the stator 110 from above. Accordingly, the mover 120 is supported from below by the memory alloy wire 61 having a coiled shape.

Figure 16:
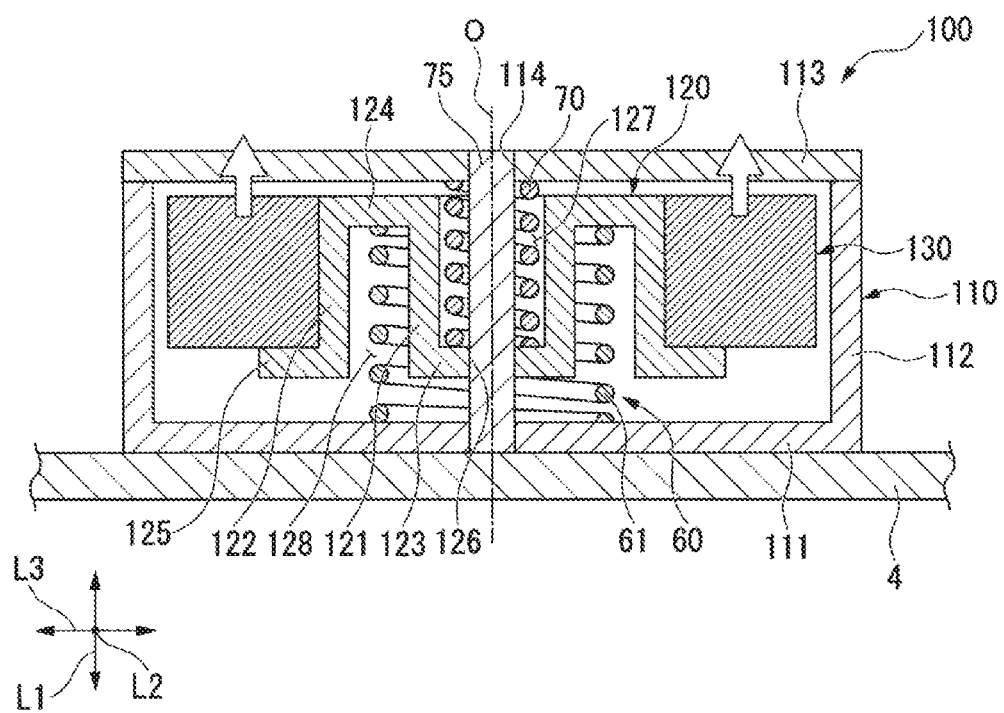
FIG. 16 is a longitudinal sectional view showing the inertial force imparting device in a state in which the mover is moved away from the stator from the state shown in FIG. 15.

In addition, the shape memory alloy wire 61 according to the present embodiment is configured to be expanded instantaneously by heating by energization, as shown in FIG. 16. As a result, the shape memory alloy wire 61 can move to push the mover 120 upward along the thickness direction L1 which is the movable direction, such that the mover 120 can be separated away from the bottom wall portion 111 of the stator 110.

Thereafter, the shape memory alloy wire 61 contracts by heat radiation and returns to the original state thereof as shown in FIG. 15. As described above, the shape memory alloy wire 61 can change the interval between the mover 120 and the stator 110 by the expansion and contraction accompanying the energization heating.

The stator 110 and the mover 120 described above are formed of a material having a higher thermal conductivity than that of the shape memory alloy wire 61, as in the first embodiment. Specifically, the stator 110 and the mover 120 are formed of an aluminum material, and an anodic oxide film serving as an insulating film formed on surfaces thereof by anodizing treatment or the like. Accordingly, the stator 110 and the mover 120 are arranged in contact with the shape memory alloy wire 61 and serve as a heat radiation body (heat transfer body according to the present invention) that radiates the heat of the shape memory alloy wire 61.

The connection terminal 62 is not shown in FIGS. 15 and 16. The connection terminal 62 is formed on the bottom wall portion 111 of the stator 110, for example.

Further, although an aluminum material subjected to anodizing treatment has been described as an example of the material having a thermal conductivity higher than that of the shape memory alloy wire 61, as described in the first embodiment, the present invention is not limited to this example, and for example, other metal materials may be used, and a synthetic resin or the like may be employed.

As shown in FIG. 15, the coil spring 70 is housed in the first housing portion 127 coaxially with the axis O and is disposed in a compressed state. An upper end of the coil spring 70 is in contact with the cover plate 113 from below, and the lower end thereof is in contact with the closing portion 123 of the mover 120 from above.

Accordingly, the coil spring 70 biases the mover 120 toward the bottom wall portion 111 side of the stator 110 by using an elastic restoring force (biasing force).

Since the mover 120 is biased toward the bottom wall portion 111 side of the stator 110 as described above, the mover 120 is in a state of being interposed between the shape memory alloy wire 61 and the coil spring 70. Further, the mover 120 biased by the coil spring 70 is restrained from being further displaced to the bottom wall portion 111 side of the stator 110 by the shape memory alloy wire 61, and is in a state of being positioned as shown in FIG. 15.

The weight 130 is formed in a ring shape surrounding the outer cylindrical portion 122 of the mover 120 from the outside in the radial direction, and is integrally combined with the outer side of the outer cylindrical portion 122 in a state of being in contact with the flange portion 125 from above. Therefore, the weight 130 can be moved in conjunction with the mover 120 in the thickness direction L1 according to expansion and contraction of the shape memory alloy wire 61.

The weight 130 may be integrally combined with the outer cylindrical portion 122 of the mover 120 by adhesion, welding, fitting, or the like, for example. Furthermore, when the mover 120 is formed of a synthetic resin, for example, the mover 120 and the weight 130 may be integrally combined by performing so-called insert molding, in which the weight 130 is used as an insert part and the mover 120 is molded by the injection molding with the weight 130.

Since the inertial force imparting device 100 is configured as described above, the weight 130 is attached to the mover 120 to have an overlapping positional relationship with the mover 120, the shape memory alloy wire 61, the coil spring 70, and the guide rod 75 in the orthogonal direction (the first direction L2 and the second direction L3) that is the radial direction orthogonal to the thickness direction L1 (movable direction).

(Operation of Inertial Force Imparting Device)

In the inertial force imparting device 100 according to the present embodiment configured as described above, the only difference from that of the first embodiment is the direction in which the mover 120 is moved, and the same effects as those in the first embodiment can also be achieved.

Specifically, by energizing the shape memory alloy wire 61, the shape memory alloy wire 61 can be heated and expanded instantaneously. Accordingly, as shown in FIG. 16, the mover 120 can be pushed upward by using the shape memory alloy wire 61, and the mover 120 can be separated away from the bottom wall portion 111 of the stator 110 against the elastic restoring force (biasing force) of the coil spring 70.

Therefore, while elastically deforming the coil spring 70, the mover 120 to which the weight 130 is attached can be instantaneously moved along the thickness direction L1 which is the movable direction, so that the inertial force (thrust) of the mover 120 and the weight 130 can be delivered to the entire casing 3, and a tactile sensation as if giving a click feeling can be delivered to the fingertip touching on the touch panel 2.

Furthermore, by radiating the heat generated by energization heating from the shape memory alloy wire 61, the shape memory alloy wire 61 can be contracted instantaneously, for example. Therefore, as the shape memory alloy wire 61 contracts, the mover 120 can be instantaneously moved in the reverse direction (downward) along the thickness direction L1 which is the movable direction by using the biasing force of the coil spring 70, and thus, can be returned to the state shown in FIG. 15.

At the time of this return, a tactile sensation as if giving a click feeling can be delivered to the fingertip touching on the touch panel 2 in the same manner as before.

Therefore, in the case of the present embodiment, again, the mover 120 can be vibrated in the thickness direction L1 by utilizing the expansion and contraction of the shape memory alloy wire 61, and the same effects as those in the first embodiment can also be achieved.

Furthermore, in the case of the present embodiment, since the mover 120, the shape memory alloy wire 61, the coil spring 70, the guide rod 75, and the weight 130 are arranged to overlap with each other in the radial direction, the entire inertial force imparting device 100 can be configured more compactly, and can be easily reduced in thickness and size. In addition, since the weight 130 can be formed in a ring shape with a large diameter, it is easy to increase the weight. Therefore, it is easy to deliver the inertial force of the mover 120 and the weight 130 to the casing 3 more effectively, and it is possible to deliver a tactile sensation as if giving a click feeling to the fingertip effectively.

Fifth Embodiment

Next, a fifth embodiment according to the present invention will be described with reference to the drawings. In the fifth embodiment, the same parts as those of the fourth embodiment are denoted by the same reference numerals, and the description thereof is omitted.

In the fourth embodiment, the mover 120 and the weight 130 are formed separately, but in the present embodiment, the mover and the weight are integrally formed.

Figure 17:
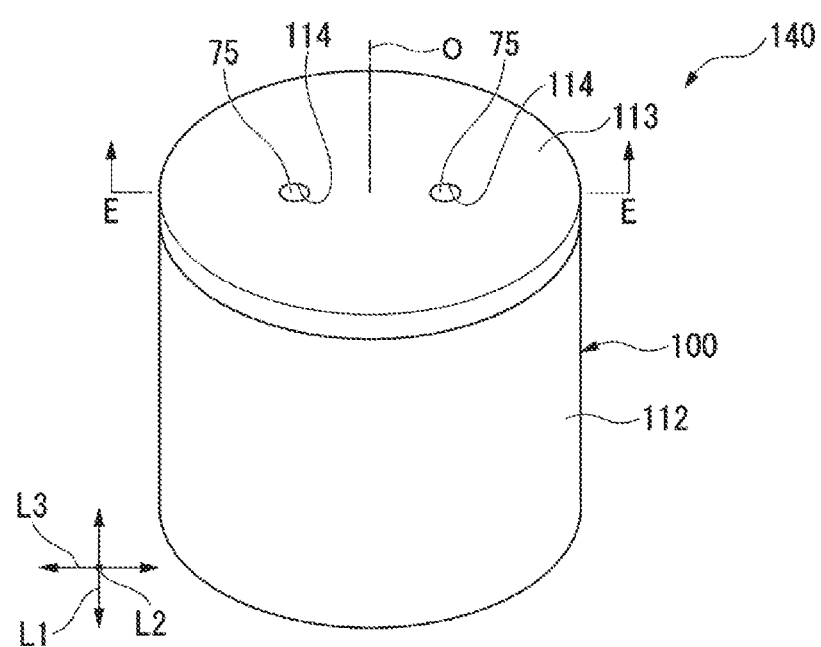
FIG. 17 is a perspective view showing an inertial force imparting device according to a fifth embodiment of the present invention.
Figure 18:
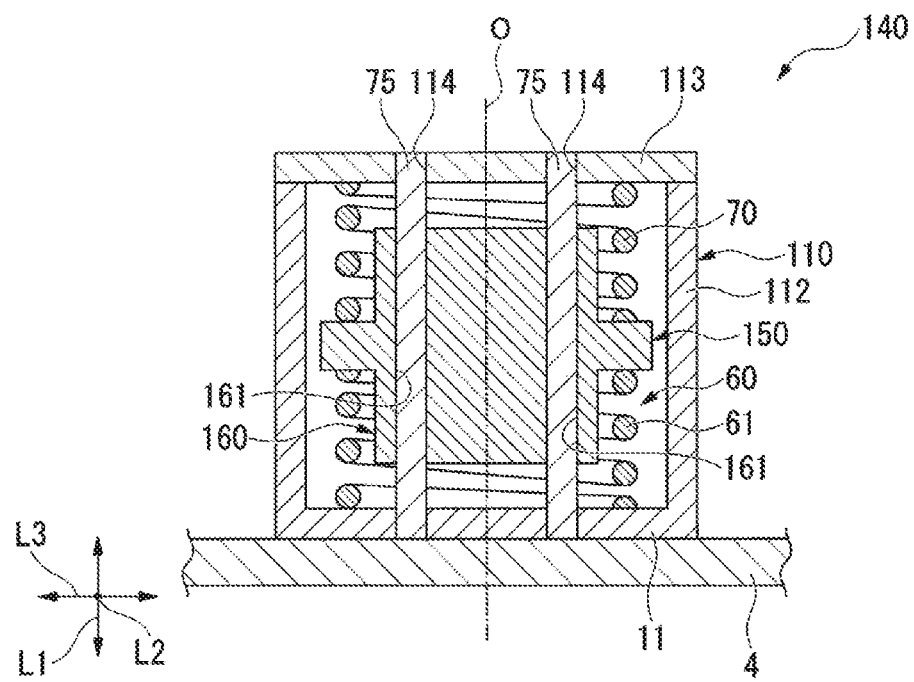
FIG. 18 is a longitudinal sectional view showing the inertial force imparting device taken along line E-E shown in FIG. 17.

As shown in FIGS. 17 and 18, an inertial force imparting device 140 according to the present embodiment is provided with two guide rods 75 which are arranged in the radial direction with the axis O interposed therebetween and also arranged in parallel with the axis O. The control board 4 is not shown in FIG. 17.

A mover 150 is formed in a ring shape surrounding the two guide rods 75 from the outside in the radial direction, and is housed inside the peripheral wall portion 112 of the stator 110 in a state of being in a coaxial arrangement with the axis O. A weight 160 is formed in a columnar shape in which a length along the thickness direction L1 is shorter than the diameter, and is disposed inside the mover 150.

The mover 150 is formed of the same material (for example, tungsten) as the weight 160 and is formed integrally with the weight 160. Thereby, in the present embodiment, the mover 150 can also be used as the weight 160. The mover 150 is integrally formed at the center portion of the weight 160 in the thickness direction L1.

The weight 160 is formed with two guide holes 161 which penetrate the weight 160 in the thickness direction L1 and through which the guide rods 75 are inserted respectively. Accordingly, the weight 160 and the mover 150 are movable in a straight line in the thickness direction L1 while being guided by the guide rod 75. Moreover, since the two guide rods 75 are formed, the weight 160 and the mover 150 are movable in the thickness direction L1 in a state of being prevented from rotating in the circumferential direction.

The shape memory alloy wire 61 is disposed coaxially with the axis O between the mover 150 and the bottom wall portion 111 of the stator 110, while surrounding the weight 160 from the outside in the radial direction. The upper end of the shape memory alloy wire 61 is in contact with the mover 150 from below, and the lower end thereof is in contact with the bottom wall portion 111 of the stator 110 from above. Accordingly, the mover 150 is supported from below by the coiled shape memory alloy wire 61.

The coil spring 70 is disposed coaxially with the axis O in a compressed state between the mover 150 and the cover plate 113, while surrounding the weight 160 from the outside in the radial direction. The upper end of the coil spring 70 is in contact with the cover plate 113 from below, and the lower end thereof is in contact with the mover 150 from above.

Accordingly, the coil spring 70 biases the mover 150 toward the bottom wall portion 111 side of the stator 110 by using an elastic restoring force (biasing force).

Since the mover 150 is biased toward the bottom wall portion 11 side of the stator 110 as described above, the mover 150 is in a state of being interposed between the shape memory alloy wire 61 and the coil spring 70 as shown in FIG. 18. Further, the mover 150 biased by the coil spring 70 is restrained from being further displaced to the bottom wall portion 111 side of the stator 110 by the shape memory alloy wire 61, and is in a state of being positioned as shown in FIG. 18.

Even in the case of the present embodiment, the weight 160 is configured to have an overlapping positional relationship with the mover 150, the shape memory alloy wire 61, the coil spring 70, and the guide rod 75 in the orthogonal direction (the first direction L2 and the second direction L3) that is the radial direction orthogonal to the thickness direction L1 (movable direction).

(Operation of Inertial Force Imparting Device)

Figure 19:
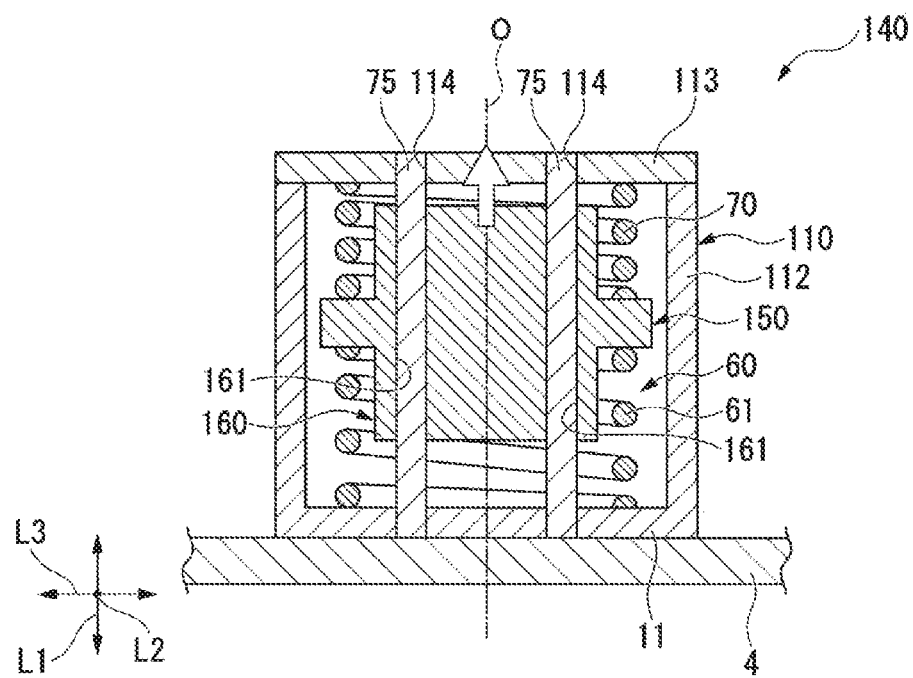
FIG. 19 is a longitudinal sectional view showing the inertial force imparting device in a state in which the mover is moved away from the stator from the state shown in FIG. 18.
Figure 20:
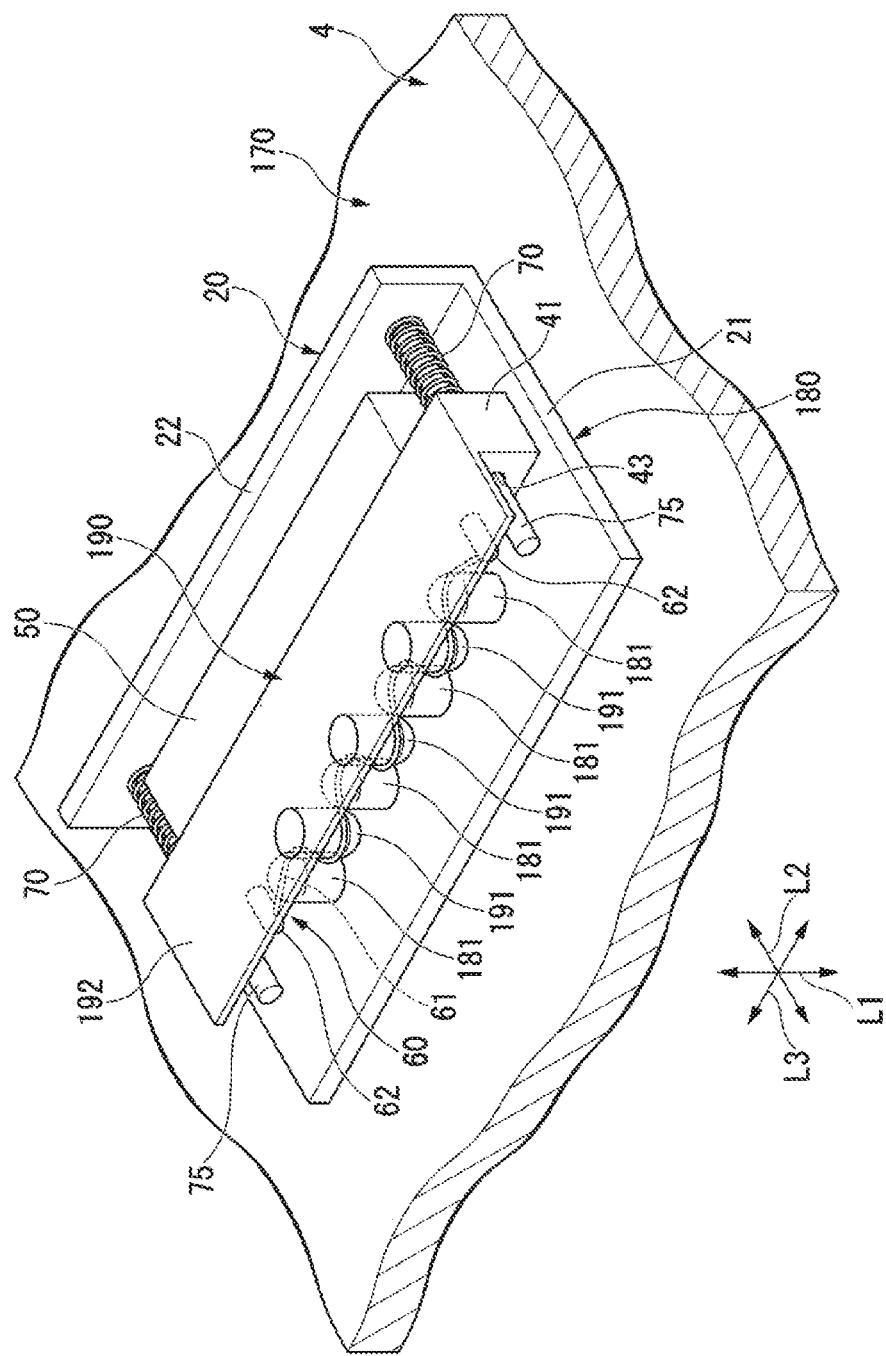
FIG. 20 is a perspective view showing an inertial force imparting device according to a sixth embodiment of the present invention.
Figure 21:
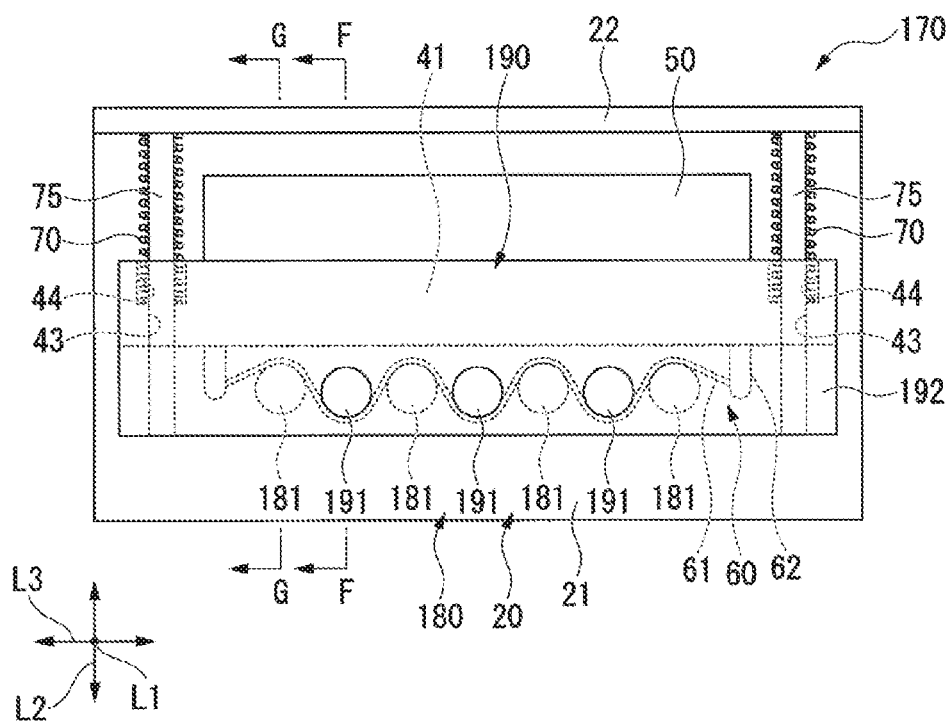
FIG. 21 is a top view showing the inertial force imparting device shown in FIG. 20.
Figure 22:
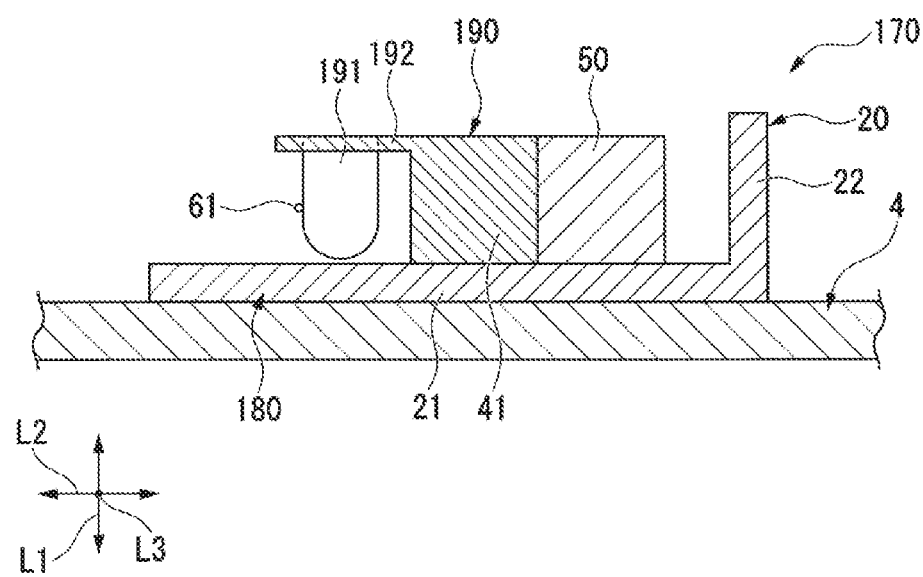
FIG. 22 is a longitudinal sectional view showing the inertial force imparting device along line F-F shown in FIG. 21.
Figure 23:
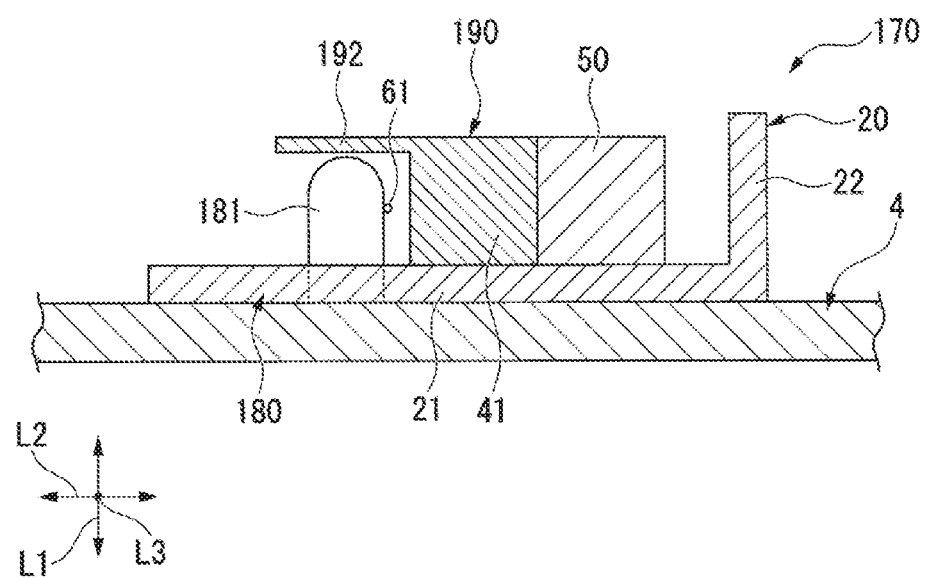
FIG. 23 is a longitudinal sectional view showing the inertial force imparting device along line G-G shown in FIG. 21.

In the inertial force imparting device 140 according to the present embodiment configured as described above, the shape memory alloy wire 61 can be expanded instantaneously by the energization of the shape memory alloy wire 61 to push the mover 150 upward as shown in FIG. 19.

Therefore, the inertial force imparting device 140 according to the present embodiment can also achieve the same effects as those of the fourth embodiment.

In addition, in the case of the present embodiment, since the mover 150 can also be used as the weight 160, the entire weight of the weight 160 and the mover 150 can be increased compared to the case of the fourth embodiment. Therefore, it is easy to deliver the inertial force of the mover 150 and the weight 160 to the casing 3 more effectively, and deliver a tactile sensation as if giving a click feeling to the fingertip effectively.

Further, compared to the case of the fourth embodiment, the entire size of the inertial force imparting device 140 can be reduced, and it is easy to achieve further miniaturization.

Sixth Embodiment

Next, a sixth embodiment according to the present invention will be described with reference to the drawings. In the sixth embodiment, the same parts as those of the first embodiment are denoted by the same reference numerals, and the description thereof is omitted.

In the first embodiment, the stator 30 is formed to have the protrusion 32 protruding from the base 31 toward the mover 40 side, and the mover 40 is formed to have the protrusion 42 protruding from the base 41 toward the stator 30 side, but in the present embodiment, the stator includes a plurality of fixed pins, and the mover includes a plurality of movable pins.

As shown in FIGS. 20 to 23, an inertial force imparting device 170 according to the present embodiment includes a stator 180 having a plurality of fixed pins 181 and a mover 190 having a plurality of movable pins 191. The control board 4 is not shown in FIG. 21.

The stator 180 includes the base table 20 disposed in a first direction L2 which is a movable direction, and the plurality of fixed pins 181 attached to the base plate 21 of the base table 20 so as to protrude in the thickness direction L1. In the present embodiment, the base table 20 in the first embodiment also serves as the stator 180.

The fixed pins 181 are formed in a columnar shape, and is attached to the base plate 21 so as to protrude upward from the base plate 21. Specifically, the fixed pins 181 are fixed to the base plate 21 by press-fitting.

However, the method of attaching the fixed pins 181 to the base plate 21 is not limited to this example, and the fixed pins 181 may be fixed by adhesion or the like, for example. In addition, for example, when the base table 20 including the base plate 21 is formed of a synthetic resin material and the fixed pins 181 are formed of a metal material, the base plate 21 and the fixed pins 181 may be combined integrally by insert molding.

A tip (upper end) of the fixed pin 181 is formed in a rounded hemispherical shape. However, the present invention is not limited to this example, and the tip of the fixed pin 181 may be formed in a flat shape.

The fixed pin 181 is formed with a length such that the tip is close to a movable plate 192 to be described below, or with a length such that a slight gap is ensured between the tip and the movable plate 192.

The fixed pins 181 described above are arranged at constant intervals in the first direction L2 which is a movable direction, and the second direction L3 orthogonal to the thickness direction L1 which is a direction orthogonal to the movable direction. In the illustrated example, four fixed pins 181 are attached to the base plate 21. However, the number of fixed pins 181 is not limited to this example.

The mover 190 is mounted on the upper surface of the base plate 21 to be slidable in the first direction L2. The mover 190 includes the base 41 extending along the second direction L3, the movable plate 192 protruding forward from the upper end of the base 41 and covering the plurality of fixed pins 181 from above, and the plurality of movable pins 191 attached to the movable plate 192 to protrude in the thickness direction L1.

The movable plate 192 has a length along the second direction L3 equivalent to that of the base 41, and is disposed in parallel with the base plate 21 along the first direction L2. Therefore, the movable plate 192 is disposed above the base plate 21 and is disposed to face the base plate 21 in the thickness direction L1.

The movable pins 191 are formed in a columnar shape, and are attached to the movable plate 192 to protrude downward from the movable plate 192. Specifically, the movable pins 191 are fixed to the movable plate 192 by press-fitting.

However, the method of attaching the movable pins 191 to the movable plate 192 is not limited to this example, and the movable pins 191 may be fixed by adhesion or the like, for example. Furthermore, for example, when the movable plate 192 and the base 41 are formed of a synthetic resin material and the movable pins 191 are formed of a metal material, the movable plate 192 and the movable pins 191 may be combined integrally by insert molding.

A tip (lower end) of the movable pin 191 is formed in a rounded hemispherical shape. However, the present invention is not limited to this example, and the tip of the movable pin 191 may be formed in a flat shape.

The movable pin 191 is formed with a length such that the tip is close to the base plate 21 or with a length such that a slight gap is ensured between the tip and the base plate 21.

The movable pins 191 described above are arranged at constant intervals in the second direction L3. In the illustrated example, three movable pins 191 are attached to the movable plate 192. However, the number of movable pins 191 is not limited to this example.

The interval between the plurality of fixed pins 181 and the interval between the plurality of movable pins 191 are the same interval (pitch) as each other. Further, the length of the fixed pin 181 is equal to the length of the movable pin 191. Accordingly, the fixed pins 181 and the movable pins 191 are alternately arranged at a constant interval along the second direction L3.

The material of the fixed pins 181 and the movable pins 191 is not particularly limited, and for example, the fixed pins 181 and the movable pins 191 are formed of a material having a higher thermal conductivity than that of the shape memory alloy wire 61. Specifically, the fixed pins 181 and the movable pins 191 are formed of an aluminum material, and an anodic oxide film serving as an insulating film is formed on the surfaces thereof by anodizing treatment or the like.

However, the fixed pins 181 and the movable pins 191 may be formed of a metal material other than aluminum, such as brass, or may be formed of a synthetic resin material.

The fixed pins 181 and the movable pins 191 according to the present embodiment are disposed to contact the shape memory alloy wire 61 and also serve as a heat radiation body (heat transfer body according to the present invention) that radiates heat from the shape memory alloy wire 61.

With respect to the stator 180 and the mover 190 configured as described above, the shape memory alloy wire 61 is disposed in a wave shape (zigzag shape) in the second direction L3 so as to sew between the fixed pins 181 and the movable pins 191 while alternately contacting the fixed pins 181 and the movable pins 191. Thereby, the shape memory alloy wire 61 is interposed between the fixed pins 181 and the movable pins 191 in a wave shape.

Both ends of the shape memory alloy wire 61 are connected to the connection terminals 62 attached to the base 41.

(Operation of Inertial Force Imparting Device)

In the case of the inertial force imparting device 170 configured as described above, the same operational effects as those of the first embodiment can be achieved.

That is, since the shape memory alloy wire 61 is interposed in a wave shape between the fixed pins 181 and the movable pins 191, the interval between the fixed pins 181 and the movable pins 191 can be changed in the first direction L2 by expansion and contraction of the shape memory alloy wire 61. Thereby, the mover 190 to which the weight 50 is attached can be instantaneously displaced in the first direction L2 by utilizing the expansion and contraction of the shape memory alloy wire 61. Therefore, a tactile sensation as if giving a click feeling can be delivered to the fingertip touching on the touch panel 2.

Thus, in the case of the inertial force imparting device 170 using the fixed pins 181 and the movable pins 191, the same operational effects as those of the first embodiment can be achieved.

Both the upper end of the fixed pin 181 and the lower end of the movable pin 191 are formed in a rounded shape, and a close or slight gap is secured between the fixed pin 181 and the movable plate 192 and between the movable pin 191 and the base plate 21. Therefore, even when the fixed pin 181 and the movable pin 191 are used, the movement of the mover 190 is not hindered, and the mover 190 can also be smoothly moved.

In particular, in the case of the present embodiment, since the stator 180 is configured by attaching the fixed pins 181 to the base plate 21, it is sufficient that at least the fixed pins 181 have an insulating property and a predetermined thermal conductivity, and the stator 180 can be simply configured. Therefore, the stator 180 can be manufactured at a low cost.

For example, a solid aluminum bar may be used as the fixed pin 181 by finishing to a predetermined outer diameter, then cut to a predetermined length, and then processing the tip to have a rounded shape. Therefore, the stator 180 can be manufactured at a low cost.

In addition, since the base table 20 including the base plate 21 can be formed of a material different from the fixed pins 181, such as a synthetic resin material, the degree of freedom in material selection can be improved, and further cost reduction can be easily achieved.

In addition, since the mover 190 is also provided with the movable pins 191, the same effect as that of the stator 180 described above can be achieved.

In the sixth embodiment, a case where the fixed pins 181 and the movable pins 191 are employed instead of the protrusions 32 of the stator 30 and the protrusions 42 of the mover 40 in the first embodiment described as an example, but the fixed pins 181 and the movable pins 191 may be employed in the second embodiment and the third embodiment.

As described above, although embodiments of the present invention are described, these embodiments are shown as an example and not intended to limit the scope of the invention. The embodiments can be implemented in various other forms, and various omissions, substitutions, and changes can be made without departing from the spirit of the invention. Embodiments and modifications thereof include, for example, those that can be easily assumed by those skilled in the art, substantially the same, equivalents, and the like.

Figure 24:
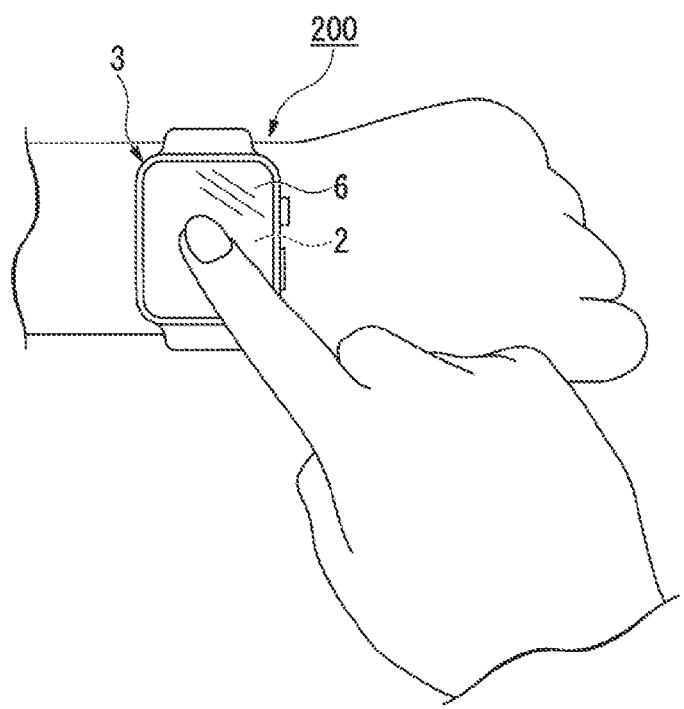
FIG. 24 is an external view showing a tactile sensation presenting device according to the present invention applied to a smartwatch.

For example, in each of the above embodiments, although the case where the tactile sensation presenting device is applied to the portable information terminal 1 such as a smartphone has been described as an example, for example, the present invention may be applied to a smartwatch 200 as shown in FIG. 24. Furthermore, the present invention is not limited to a portable information terminal, and for example, may be applied to an in-vehicle car navigation system or the like, and may be applied to various electronic devices that simulatively deliver a physical operation tactile sensation to a fingertip upon touching.

What is claimed is:

1. An inertial force imparting device comprising:
   a stator;
   a mover arranged to be movable relative to the stator in a movable direction;
   a weight attached to the mover;
   an actuator unit that includes a shape memory alloy wire provided between the stator and the mover, instantaneously displaces the mover in the movable direction, and delivers an inertial force to the outside based on the displacement; and
   an elastic member directly connected to the mover that biases the mover toward the stator side along the movable direction, wherein
   the shape memory alloy wire changes in length according to temperature, and changes the interval between the mover and the stator by expansion and contraction according to energization heating.

2. The inertial force imparting device according to claim 1, wherein
   the actuator unit includes a heat transfer body arranged to contact the shape memory alloy wire.

3. The inertial force imparting device according to claim 1, wherein
   the elastic member is formed such that an elastic modulus in the movable direction is lower than the elastic modulus in an orthogonal direction orthogonal to the movable direction, and guides the mover to be movable along the movable direction according to a difference in elastic modulus.

4. The inertial force imparting device according to claim 1, wherein
   the weight is attached to the mover so that at least a portion thereof has an overlapping positional relationship with at least one of the mover, the shape memory alloy wire, the elastic member, and the stator, in an orthogonal direction orthogonal to the movable direction.

5. The inertial force imparting device according to claim 1, wherein
   the elastic member is provided such that at least a portion thereof has an overlapping positional relationship with the shape memory alloy wire in an orthogonal direction orthogonal to the movable direction.

6. The inertial force imparting device according to claim 1, comprising:
   a guide member that guides the mover to be movable in the movable direction.

7. The inertial force imparting device according to claim 1, wherein
   the mover is formed of the same material as the weight and is formed integrally with the weight.

8. The inertial force imparting device according to claim 1, wherein
   the stator includes a fixing plate arranged along the movable direction, and a plurality of fixed pins attached to the fixing plate to protrude in an orthogonal direction orthogonal to the movable direction,
   the mover includes a movable plate which is arranged along the movable direction and is arranged such that at least a portion thereof faces the fixing plate in the orthogonal direction, and a plurality of movable pins attached to the movable plate to protrude in the orthogonal direction,
   the plurality of fixed pins and the plurality of movable pins are arranged to be alternately arranged at constant intervals along a direction orthogonal to the movable direction and the orthogonal direction, and
   the shape memory alloy wire is interposed between the fixed pins and the movable pins in a wave shape while alternately contacting the fixed pins and the movable pins.

9. A tactile sensation presenting device comprising:
   the inertial force imparting device according to claim 1;
   a casing having an operation panel to be operated by a fingertip, and housing the inertial force imparting device therein;
   a display panel provided on the casing and displaying information through the operation panel; and
   a control unit housed in the casing and controlling the display of the display panel in accordance with an operation of the operation panel.

* * * * *